US010192564B2

(12) United States Patent
Heber et al.

(10) Patent No.: US 10,192,564 B2
(45) Date of Patent: *Jan. 29, 2019

(54) SIGNAL QUALITY-BASED ENHANCEMENT AND COMPENSATION OF COMPRESSED AUDIO SIGNALS

(71) Applicant: HARMAN INTERNATIONAL INDUSTRIES, INCORPORATED, Stamford, CT (US)

(72) Inventors: Kevin Eric Heber, Carmel, IN (US); Gilbert Arthur Joseph Soulodre, Kanata (CA)

(73) Assignee: Harman International Industries, Incorporated, Stamford, CT (US)

( * ) Notice: Subject to any disclaimer, the term of this patent is extended or adjusted under 35 U.S.C. 154(b) by 102 days.

This patent is subject to a terminal disclaimer.

(21) Appl. No.: 15/108,740

(22) PCT Filed: Jan. 6, 2015

(86) PCT No.: PCT/US2015/010266

§ 371 (c)(1),
(2) Date: Jun. 28, 2016

(87) PCT Pub. No.: WO2015/105775

PCT Pub. Date: Jul. 16, 2015

(65) Prior Publication Data

US 2016/0329061 A1 Nov. 10, 2016

Related U.S. Application Data

(60) Provisional application No. 61/924,641, filed on Jan. 7, 2014.

(51) Int. Cl.
*G10L 19/26* (2013.01)
*G10L 19/005* (2013.01)
(Continued)

(52) U.S. Cl.
CPC ............ *G10L 19/26* (2013.01); *G10L 19/005* (2013.01); *G10L 19/167* (2013.01);
(Continued)

(58) Field of Classification Search
CPC .............................. G10L 19/00; G10L 19/008
(Continued)

(56) References Cited

U.S. PATENT DOCUMENTS 5,410,632 A * 4/1995 Hong ...................... G10L 25/78 704/201
6,889,187 B2 * 5/2005 Zhang ..................... G10L 25/78 704/233
(Continued)

FOREIGN PATENT DOCUMENTS

WO 2006006809 A1 1/2006
WO WO 2014081548 * 11/2013
(Continued)

OTHER PUBLICATIONS

International Search Report and Written Opinion for PCT/US2015/010266 dated Mar. 30, 2015.

*Primary Examiner* — Forrest F Tzeng
(74) *Attorney, Agent, or Firm* — Brooks Kushman P.C.

(57) ABSTRACT

A sampler module may divide an audio signal into a series of sequential samples. A signal quality detector module may identify a consistent brick wall frequency of the audio signal spanning a plurality of the sequential samples at an outset of the audio signal and determine a signal treatment indication proportional to the brick wall frequency. A signal enhancer module may sequentially receive and analyze one or more sample components of the audio signal to identify lost parts of the audio signal in the one or more sample components of respective sequential samples, and generate, in accordance with the signal quality indication, a corresponding signal treatment for each of the one or more sample components of respective sequential samples having a corresponding identified lost part.

31 Claims, 14 Drawing Sheets

(51) Int. Cl.

*G10L 19/16* (2013.01)
*G10L 21/038* (2013.01)
*G10L 19/008* (2013.01)
*G10L 25/18* (2013.01)

(52) U.S. Cl.

CPC .......... *G10L 21/038* (2013.01); *G10L 19/008* (2013.01); *G10L 25/18* (2013.01)

(58) Field of Classification Search

USPC .......................................... 704/500, E19.001
See application file for complete search history.

(56) References Cited

U.S. PATENT DOCUMENTS 8,996,362 B2 * 3/2015 Nagel .................. G10L 21/038
704/203
9,589,576 B2 * 3/2017 Sverrisson ............ G10L 21/038
9,626,978 B2 * 4/2017 Naslund .............. G10L 21/0388
2004/0033056 A1 * 2/2004 Montag .................. H03G 5/005
381/113
2007/0092089 A1 4/2007 Seefeldt et al.
2008/0232617 A1 9/2008 Goodwin et al.
2011/0081024 A1 4/2011 Soulodre
2011/0288873 A1 * 11/2011 Nagel ................... G10L 19/265
704/500
2012/0063608 A1 3/2012 Soulodre
2014/0169542 A1 * 6/2014 Caramma ............. H04M 3/568
379/202.01
2016/0180854 A1 * 6/2016 Lecomte ................. G10L 19/24
704/205

FOREIGN PATENT DOCUMENTS

WO WO 2014081548 A1 * 11/2013
WO 2014081548 A1 5/2014

* cited by examiner

SIGNAL QUALITY-BASED ENHANCEMENT AND COMPENSATION OF COMPRESSED AUDIO SIGNALS

CROSS-REFERENCE TO RELATED APPLICATION

This application is the U.S. national phase of PCT Application No. PCT/US2015/010266 filed Jan. 6, 2015, which claims the benefit of U.S. provisional application Ser. No. 61/924,641 filed Jan. 7, 2014, the disclosures of which are hereby incorporated in their entirety by reference herein.

TECHNICAL FIELD

Aspects of the disclosure relate to audio signal processing and more particularly to audio signal enhancement and restoration.

BACKGROUND

Compressed audio signals are signals which have undergone some form of data compression by a perceptual audio codec. Perceptual audio codecs reduce the amount of data used to store, transfer, or transmit an audio signal by discarding components of the audio signal that are perceived to be less audible or less perceptually important. The data compression process often introduces undesirable audible differences between the original (uncompressed) audio signal and the compressed audio signal. Different perceptual audio codecs may employ different strategies for discarding portions of the original audio signal, but the perceived characteristics of the audible differences are typically similar.

SUMMARY

A sampler module may divide an audio signal into a series of sequential samples. A signal quality detector module may identify a consistent brick wall frequency of the audio signal spanning a plurality of the sequential samples at an outset of the audio signal and determine a signal treatment indication proportional to the brick wall frequency. A signal enhancer module may sequentially receive and analyze one or more sample components of the audio signal to identify lost parts of the audio signal in the one or more sample components of respective sequential samples, and generate, in accordance with the signal quality indication, a corresponding signal treatment for each of the one or more sample components of respective sequential samples having a corresponding identified lost part.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
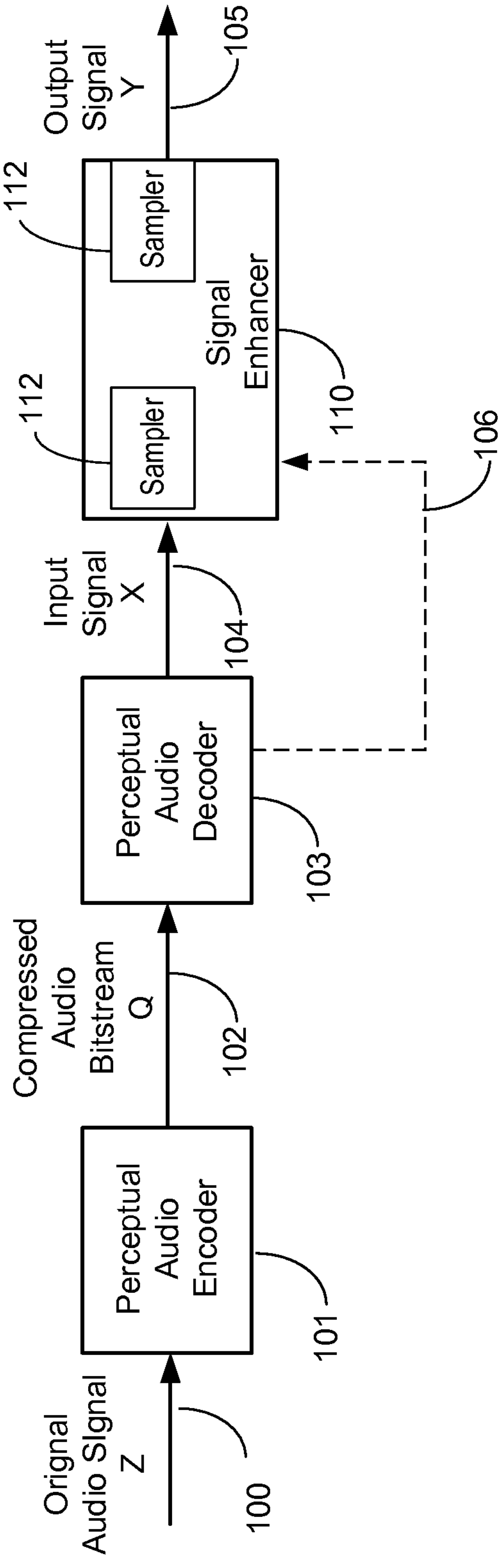
FIG. 1 is a block diagram that includes an example Signal Enhancer system used in conjunction with a perceptual audio encoder and decoder.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Compressed audio signals are signals containing audio content, which have undergone some form of data compression, such as by a perceptual audio codec. Common types of perceptual audio codecs include MP3, AAC, Dolby Digital, and DTS. These perceptual audio codecs reduce the size of an audio signal by discarding a significant portion of the audio signal. Perceptual audio codecs can be used to reduce the amount of space (memory) required to store an audio signal, or to reduce the amount of bandwidth required to transmit or transfer audio signals. It is not uncommon to compress an audio signal by 90% or more. Perceptual audio codecs can employ a model of how the human auditory system perceives sounds. In this way a perceptual audio codec can discard those portions of the audio signal which are deemed to be either inaudible or least relevant to perception of the sound by a listener. As a result, perceptual audio codecs are able to reduce the size of an audio signal while still maintaining relatively good perceived audio quality with the remaining signal. In general, the perceived quality of a compressed audio signal can be dependent on the bitrate of the compressed signal. Lower bitrates can indicate that a larger portion of the original audio signal was discarded and therefore, in general, the perceived quality of the compressed audio signal can be poorer.

There are numerous types of perceptual audio codecs and each type can use a different set of criteria in determining which portions of the original audio signal will be discarded in the compression process. Perceptual audio codecs can include an encoding and decoding process. The encoder receives the original audio signal and can determine which portions of the signal will be discarded. The encoder can then place the remaining signal in a format that is suitable for compressed storage and/or transmission. The decoder can receive the compressed audio signal, decode it, and can then convert the decoded audio signal to a format that is suitable for audio playback. In most perceptual audio codecs the encoding process, which can include use of a perceptual model, can determine the resulting quality of the compressed audio signal. In these cases the decoder can serve as a format converter that converts the signal from the compressed format (usually some form of frequency-domain representation) to a format suitable for audio playback.

The Signal Enhancer system can modify a compressed audio signal that has been processed by a perceptual audio codec such that signal components and characteristics which may have been discarded or altered in the compression process are perceived to be restored in the processed output signal. As used herein, the term audio signal may refer to either an electrical signal representative of audio content, or an audible sound, unless described otherwise.

When audio signals are compressed using a perceptual audio codec it is impossible to retrieve the discarded signal components. However, the Signal Enhancer system can analyze the remaining signal components in a compressed audio signal, and generate new signal components to perceptually replace the discarded components.

In some cases, a quality of a source of compressed audio signals may be explicitly specified by the audio source or may be inferred based on the audio source. In an example, Satellite radio content may be known to be encoded at a particular quality and rate. In another example metadata such as the current bitrate and codec information for the audio source may be specified via a bus message or via header information of an audio file being decoded. In such cases, the Signal Enhancer may be configured to apply a treatment level based on the quality specified by the audio source. In other cases, a source quality may be unknown or not readily predictable. Some examples of such audio sources may include a music player such as an iPod, a USB drive, audio received over a Bluetooth connection, audio received via an auxiliary connection, or audio streaming from an unknown music streaming application. In such cases, the Signal Enhancer may be configured to automatically detect a treatment level that is suitable for the audio source based on characteristics of the content of the incoming audio itself.

The automatic detection may be configured to apply a proportional amount of treatment based on a measured quality of the outset of the input signal. For example, if a brickwall slope is detected (e.g., a hard cutoff of frequencies above 12 kHz), then the audio source may be considered to be compressed, and treatment may be applied. If no brickwall slope is detected, then the audio source may be considered to be uncompressed, and treatment may be deemed unnecessary and not be applied. The particular amount of treatment to be applied may be based on the frequency cutoff point of the brickwall. For example, a lower cutoff frequency may indicate a relatively more compressed audio stream requiring a greater amount of treatment, while a higher cutoff frequency may indicate a relatively less compressed audio stream requiring a lesser amount of treatment. In some cases, if the cutoff frequency is below a minimum threshold, then the Signal Enhancer may determine that the audio source is too low quality to be processed and no treatment may be applied. As another possibility, if the cutoff frequency is above a maximum threshold, then the Signal Enhancer may determine that the audio source is of sufficient quality not to require treatment.

If an audio track lacks sufficient high frequency content, then the Signal Enhancer may determine that no treatment should be applied, despite a low audio quality or low bitrate of the audio. In an example, an audio track of a piano may lack high frequency content such that a brickwall may not be easily detectable. Or, if a track is too low in recorded level, then Signal Enhancer may also determine that no treatment is to be applied.

When initialized, or when a gap (e.g. mute or track change) is detected, the Signal Enhancer may reset a latch and set a detected treatment level to none. When audio initiates or resumes, the automatic detection mechanism may look for compression (e.g., by performing brickwall cutoff frequency detection). When a track is identified as compressed, the treatment level may be set (i.e., latched) such that the treatment level may remain within a narrow range until the next track. This latching may accordingly prevent pumping, variable sound, or other audible artifacts of changing treatment rates.

Additionally or alternately, after detection of a gap, a timer may begin counting. If no compression is detected within a predetermined period of time or number of samples (e.g., five seconds), then the Signal Enhancer may elect not to apply treatment until the next gap is detected. This may avoid unexpected spectral changes in the middle of a track due to sudden appearance of high frequencies and subsequent treatment level adjustment.

FIG. 1 is a block diagram that includes an example of a Signal Enhancer system 110. The Signal Enhancer system 110 can operate in the frequency domain or the time domain. The Signal Enhancer system 110 may include a Sampler Module 112. The Sampler Module 112 may receive the input signal (X) in real time, and divide the input signal (X) into samples. During operation in the frequency domain, the Sampler Module 112 may collect sequential time-domain samples, a suitable windowing function is applied (such as the root-Hann window), and the windowed samples are converted to sequential bins in the frequency domain, such as using a FFT (Fast Fourier Transform). In an example, the Sampler Module 112 may utilize a 1024-point FFT and 44.1 kHz sampling rate. Similarly, as a final step in the Signal Enhancer system 110, the enhanced frequency-domain bins can be converted by the Sampler Module 112 to the time domain using an inverse-FFT (inverse Fast Fourier Transform), and a suitable complementary window is applied (such as a root-Hann window), to produce a block of enhanced time-domain samples. An overlap of a predetermined amount, such as at least 50%, can be used to add and window the time-domain samples prior to converting them to the frequency domain. At an output on an output line 105 of the Signal Enhancer system 110, a similar predetermined overlap, such as at least 50%, can be used when constructing the enhanced time-domain samples following conversion from the frequency-domain to the time-domain. Alternatively, the Signal Enhancer system 110 can operate in the time domain using the sequential blocks of time domain samples, and the converters may be eliminated from the Sampler Module 112. In order to simplify the discussion and figures, further discussion and illustration of the Sampler Module 112 as well as time-to-frequency and frequency-to-time conversion is omitted. Thus, as described herein, sequential samples or a sequence of samples may interchangeably refer to a time series sequence of time domain samples, or a time series sequence of frequency domain bins corresponding to time series receipt of an input signal (X) that has been sampled by the Sampler Module 112.

In FIG. 1, the Signal Enhancer 110 is illustrated as being used in conjunction with a perceptual audio encoder 101 and a perceptual audio decoder 103. An original audio signal (Z) can be provided to the perceptual audio encoder 101 on an audio signal input line 100. The perceptual audio encoder 101 may discard audio signal components, to produce a compressed audio bitstream (Q) on a compressed bitstream line 102. The perceptual audio decoder 103 may decode the compressed audio bitstream (Q) to produce an input signal (X) on an input signal line 104 (sometimes referred to herein as input signal (X) 104). The input signal (X) may be an audio signal in a format suitable for audio playback. The Signal Enhancer system 110 may operate to divide the input signal (X) into a sequence of samples in order to enhance the input signal (X) to produce an output signal (Y) on an output signal line 105. Side-chain data may contain information related to processing of the input signal (X) such as, indication of: the type of audio codec used, the codec manufacturer, the bitrate, stereo versus joint-stereo encoding, the sampling rate, the number of unique input channels, the coding block size, and a song/track identifier. In other examples, any other information related to the audio signal (X) or the encoding/decoding process may be included as part of the side chain data. The side chain data may be provided to the Signal Enhancer system 110 from the perceptual audio decoder 103 on a side chain data line 106. Alternatively, or in addition, the side chain data may be included as part of the input signal (X).

Figure 2:
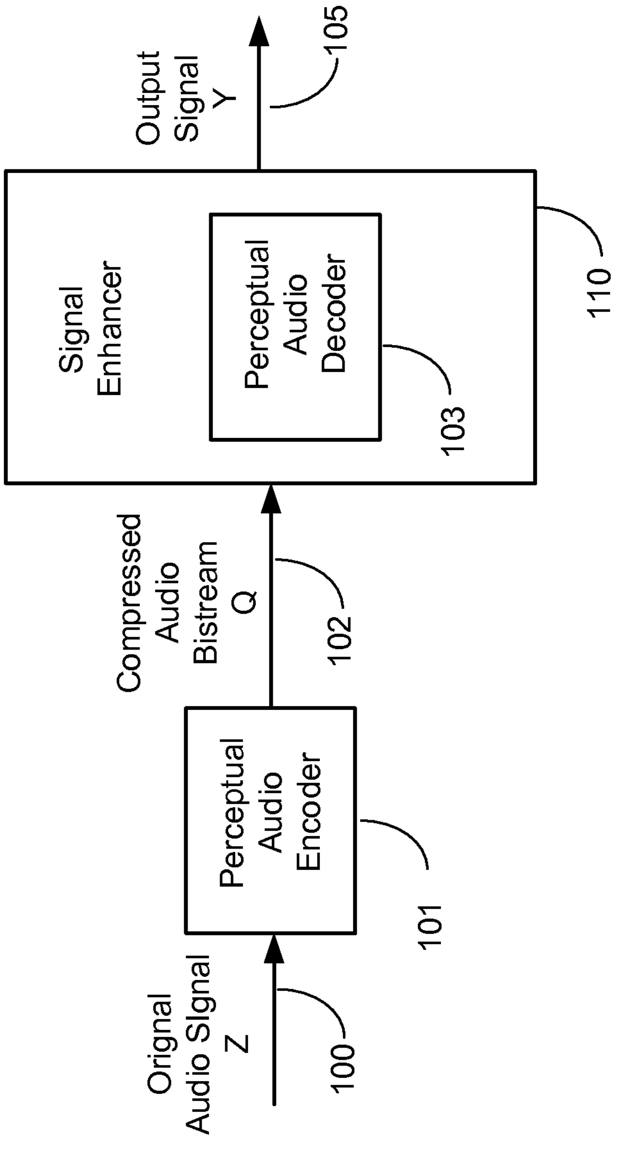
FIG. 2 is a block diagram that includes an example of a perceptual audio decoder integrated into the Signal Enhancer system.

FIG. 2 is a block diagram of an example of the Signal Enhancer system 110 used in conjunction with a perceptual audio encoder and decoder. In this case the perceptual audio decoder 103 can be incorporated as part of the Signal Enhancer system 110. As a result, the Signal Enhancer system 110 may operate directly on the compressed audio bitstream (Q) received on the compressed bitstream line 102. Alternatively, in other examples, the Signal Enhancer system 110 may be included in the perceptual audio decoder 103. In this configuration the Signal Enhancer system 110 may have access to the details of compressed audio bitstream (Q) 102.

Figure 3:
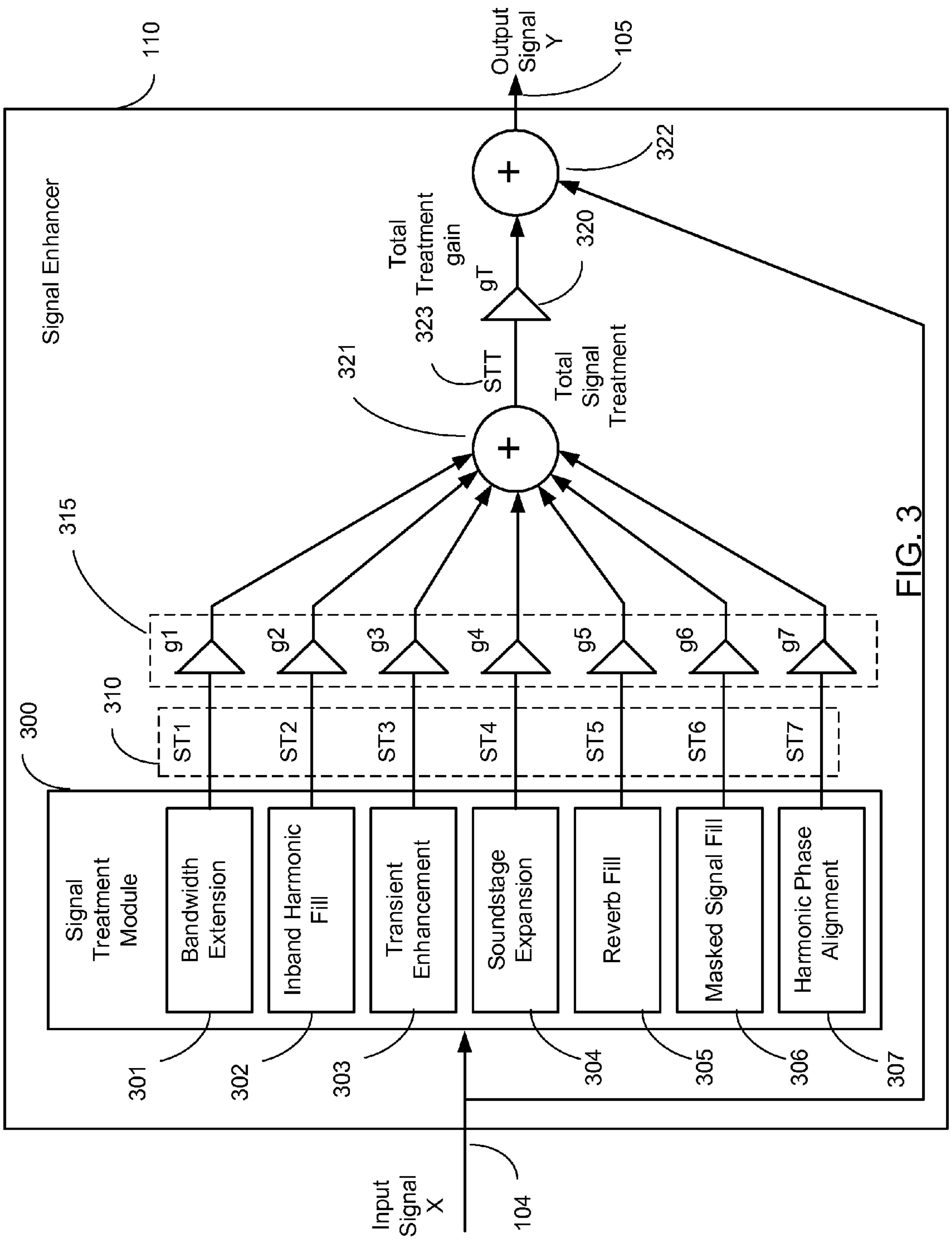
FIG. 3 is a block diagram of an example of the Signal Enhancer system.

FIG. 3 is a block diagram of an example of the Signal Enhancer system 110. In FIG. 3, the Signal Enhancer system 110 includes a Signal Treatment Module 300 that may receive the input signal (X) on the input signal line 104. The Signal Treatment Module 300 may produce a number of individual and unique Signal Treatments (ST1, ST2, ST3, ST4, ST5, ST6, and ST7) on corresponding signal treatment lines 310. Although seven Signal Treatments are illustrated, fewer or greater numbers (n) of signal treatments are possible in other examples. The relative energy levels of each of the Signal Treatments (STn) may be individually adjusted by the treatment gains (g1, g2, g3, g4, g5, g6, and g7) 315 prior to being added together at a first summing block 321 to produce a total signal treatment (STT) 323. The level of the total signal treatment (STT) 323 may be adjusted by the total treatment gain (gT) 320 prior to being added to the input signal (X) 104 at a second summing block 322.

The Signal Treatment Module 300 may include one or more treatment modules (301, 302, 303, 304, 305, 306, and 307), which operate on individual sample components of sequential samples of the input signal (X) to produce the Signal Treatments (310) sequentially on a sample-by-sample basis for each of the respective components. The individual sample component of the sequential samples may relate to different characteristics of the audio signal. Alternatively, or in addition, the Signal Treatment Module 300 may include additional or fewer treatment modules 300. The illustrated modules may be independent, or may be sub modules that are formed in any of various combinations to create modules.

Figure 4:
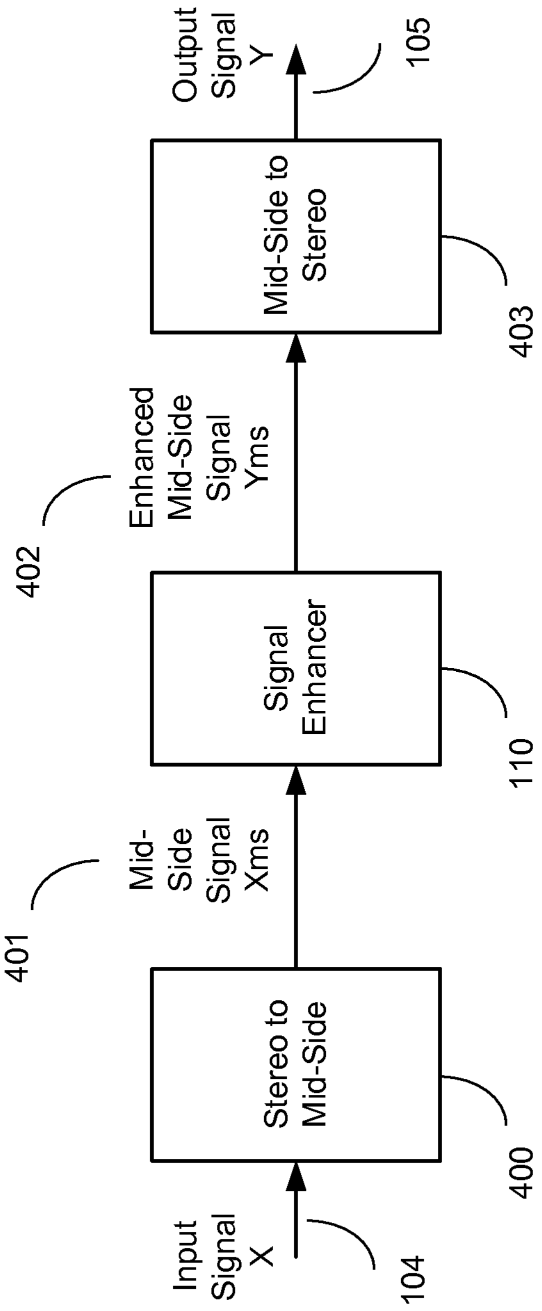
FIG. 4 is a block diagram of an example of the Signal Enhancer system operating on Mid-Side portions of a stereo signal.

FIG. 4 is an example of the Signal Enhancer system 110 operating on Mid-Side components of the input signal (X), such as extracted by a Mid-Side component module 400. The term "Mid-Side" refers to audio information in a stereo audio signal in which the audio information that is common to both a left and right stereo channel is considered "Mid" signal components of the audio information and the "Side" signal components of the audio information is audio information that is differs between the left and right stereo channels. Perceptual audio codecs can operate on the Mid-Side components of an audio signal in order to improve performance of the perceptual audio codecs. In this situation, the encoder can discard more of the Side signal component while retaining more of the Mid signal component. As such, in this situation, optimization of operation of the Signal Enhancer system 110 may be improved if the Signal Enhancer system 110 operates on the Mid-Side signal components of a stereo input signal (X) rather than directly on the Left and Right channels of the stereo signal.

In FIG. 4 a stereo to Mid-Side module 400 may convert the stereo input signal X to a Mid-Side signal configuration Xms, which may in turn be provided to the Signal Enhancer system 110 for processing on a Mid-Side signal line 401. The Signal Enhancer system 110 may operate on the Mid-Side signal Xms to produce an Enhanced Mid-Side signal (Yms). The Enhanced Mid-Side signal (Yms) may be supplied to a Mid-Side to Stereo module 403 on an enhanced Mid-Side signal line 402. The Mid-Side to Stereo module 403 may convert the Enhanced Mid-Side signal (Yms) to a stereo (Left and Right channels) output signal (Y) supplied on the output line 105.

Figure 5:
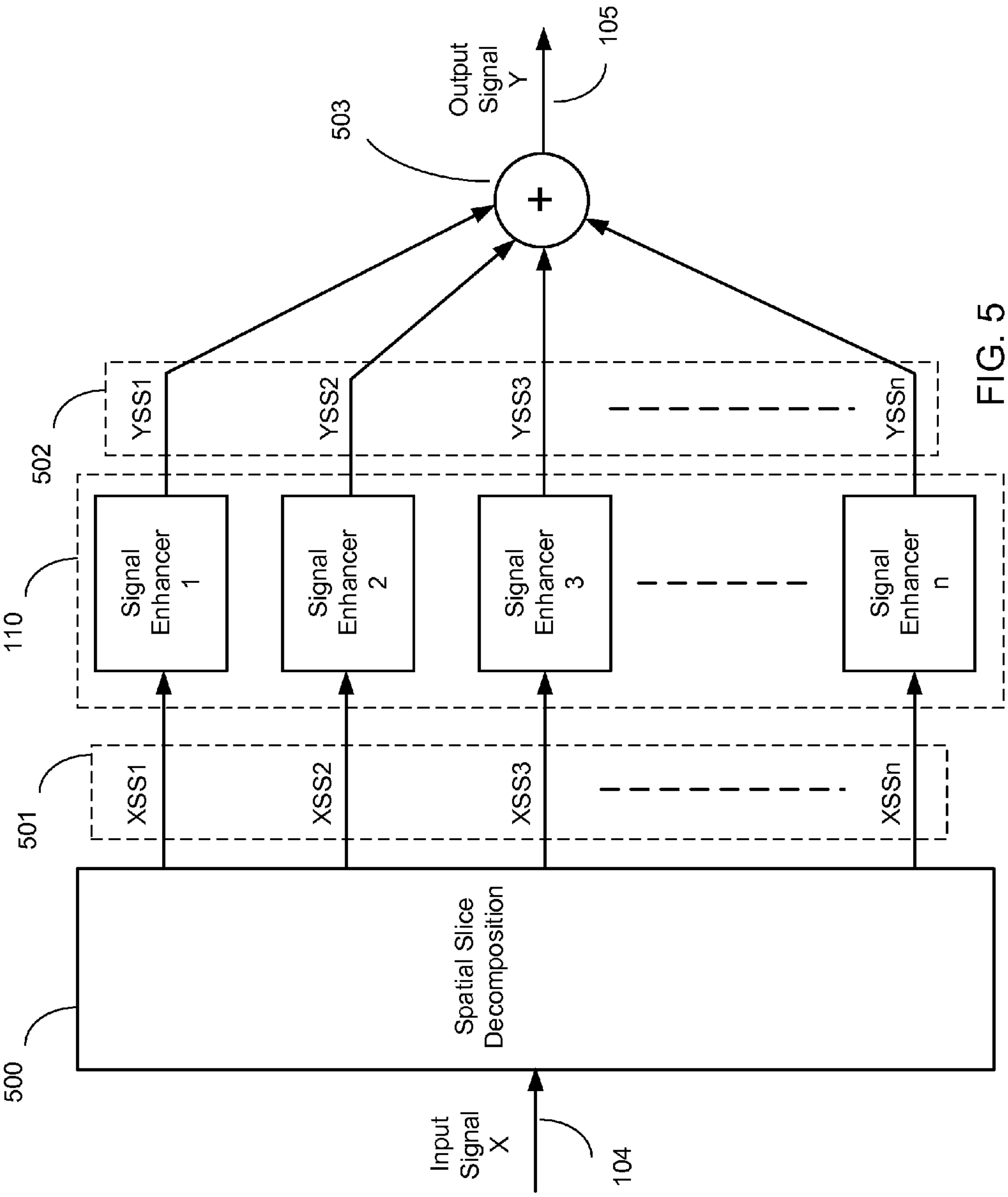
FIG. 5 is a block diagram of an example of separate Signal Enhancer modules operating on individual spatial slices of an audio signal.

FIG. 5 is an example of a set of "n" Signal Enhancer systems 110 operating on a set of "n" spatial slice streams (XSS1, XSS2, XSS3, . . . , XSSn) on a spatial slice stream line 501, which may be derived from a Spatial Slice Decomposition module 500. The Spatial Slice Decomposition module 500 may receive a stereo or multi-channel audio input signal (X) on the input signal line 104 and produce a set of spatial slice streams. The spatial slice streams may contain the outputs of a spatial filterbank which decomposes the input signal based on the spatial location of audio signal sources within a perceived stereo or multi-channel soundstage. One possible method for decomposing an input signal into spatial slices to produce spatial slice streams 501 is described in U.S. patent application Ser. No. 12/897,709 entitled "SYSTEM FOR SPATIAL EXTRACTION OF AUDIO SIGNALS", which is herein incorporated by reference in its entirety.

In FIG. 5 each of the "n" Signal Enhancers 110 produces an enhanced output stream (YSS1, YSS2, YSS3, . . . , YSSn) on an enhanced output stream line 502. The "n" output streams are combined at a summing module 503 to produce the output signal (Y) on the output line 105. Improved performance of the system may be obtained when operating separate Signal Enhancer systems 110 on individual spatial slice streams since each Signal Enhancer system 110 may operate on more isolated sample components of the audio input signal 104, and may thus be better able to derive appropriate Signal Treatments (ST1, ST2, ST3, ST4, ST5, ST6, and ST7) for each spatial slice stream (XSSn). Any number of different Signal Treatments (ST1, ST2, ST3, ST4, ST5, ST6, and ST7) may be independently derived for different sample components included in samples of each of the respective spatial slice streams (XSSn).

In FIG. 3, the Signal Treatment Module 300 may include one or more treatment modules (301, 302, 303, 304, 305, 306, and 307) to derive Signal Treatments (ST1, ST2, ST3, ST4, ST5, ST6, and ST7) for individual sample components of respective sequential samples of either an audio signal, or a spatial slice stream produced from an audio signal. Each of the treatment modules (301, 302, 303, 304, 305, 306, and 307) may derive Signal Treatments (ST1, ST2, ST3, ST4, ST5, ST6, and ST7) for different characteristics related to the audio signal or spatial stream. Example audio signal characteristics include bandwidth, harmonics, transients, expansion, reverberation, masking and harmonic phase alignment. In other examples, signal treatments may be derived for additional or fewer characteristics related to an audio signal. Signal treatments may be derived for missing parts of the audio signal that correspond to the characteristic of the respective treatment module. Accordingly, the signal treatments may effectively supply replacement portions of various different characteristics of the audio signal that are identified as missing from individual sample components in a series of samples. Thus, some of the sample components in a series where lost parts of a respective characteristic are identified may have signal treatments applied, while other sample components in the sequence where no missing parts of the respective characteristic are identified may have no signal treatments applied.

With regard to the characteristic of bandwidth being a missing part of an audio signal, some perceptual audio codecs, including those operating at relatively low bitrates, is that they may limit the bandwidth of a compressed signal by discarding signal components above some predetermined threshold. For example, a perceptual audio codec may consider all frequency components above a predetermined frequency, such as above 12 kHz, to be less perceptually important and thus discard them. The Bandwidth Extension module 301 may operate on the input signal (X) to generate signal components, or signal treatments (ST1), above such a predetermined cut-off frequency (Fx). The Bandwidth Extension module 301 may analyze the input signal (X) to determine the cut-off frequency (Fx) of the input signal, if one exists. Knowledge of the cut-off frequency (Fx) may be used to guide the generation of a Signal Treatment stream (ST1) with new signal components above the predetermined cut-off frequency (Fx) to compensate for the absence of this characteristic in the corresponding sample components of the audio signal.

Alternatively, or in addition, in cases where side-chain information 106 is available from the perceptual audio decoder 103, as shown in FIG. 1, the cut-off frequency (Fx) may be provided to the Bandwidth Extension module 301. In other cases, where the perceptual audio decoder 103 and the Signal Enhancer system 110 are integrated, such as in the example of FIG. 2, the cut-off frequency (Fx) may be provided by the perceptual audio decoder 103 directly to the Bandwidth Extension module 301

With regard to the characteristic of harmonics being a missing or lost part of an audio signal, some perceptual audio codecs, including those operating at relatively low bitrates, may discard certain "middle harmonics" within the compressed signal at a given point in time within the signal. For example, at some point in time, a perceptual audio codec may retain the fundamental frequency component of a particular sound source along with several lower order harmonics. The perceptual audio codec may also preserve some or all of the highest order harmonics of the signal, while discarding one or more of the middle harmonics of the sound source. The Inband Harmonic Fill module 302 may analyze the input signal (X) 104 to search for events where the perceptual audio codec has discarded one or more middle harmonics characteristics of the audio signal. The Inband Harmonic Fill module 302 may operate to generate a Signal Treatment stream (ST2) with new middle harmonics to apply to the audio signal in response to this characteristic missing from the sample components of the audio signal.

With regard to the characteristic of transients being a missing part of an audio signal, some perceptual audio codecs, including those operating at relatively low bitrates, may cause a "smearing" of transient signals. This type of coding artifact can be described as "pre-echo" and can most readily be heard when the transient signal has a sharp attack and is relatively loud in relation to the other signal components at the time of the transient event. Pre-echo tends to cause a perceived dulling of the transient signal components. The Transient Enhancement module 303 may seek to identify this characteristic as missing from component samples of the audio signal, and derive a signal treatment to restore the perceived sharp attack of transient signal components. The Transient Enhancement module 303 may analyze the input signal (X) and may identify transient events and transient signal components to identify the missing characteristic. The Transient Enhancement module 303 may operate to generate a Signal Treatment stream (ST3) containing new transient signal components for application to the audio signal in order to enhance the perception of the onsets of existing transient signal components.

An example method for detecting transients in an audio signal may include the following activities. The magnitudes of the FFT bins for the current block of time-domain input signal samples are computed and are stored in a history buffer. The magnitudes of the current set of FFT bins are compared to the magnitudes of a past set of FFT bins on a bin-by-bin basis, where the current set and the past set represent a series of sample components of a respective series of samples. The magnitudes of the past set of FFT bins were previously stored in the history buffer and are retrieved for this comparison. The number of bins for which the magnitude of the current FFT bin exceeds the magnitude of the past FFT bin by a predetermined threshold, such as a Magnitude Threshold, is counted. If the count exceeds a determined Count Threshold, then it is determined that the current block of time-domain samples contains a transient event. A predetermined value, such as 20 dB, may be suitable for the Magnitude Threshold for detecting transients. The past FFT bins can be taken from one or two blocks behind the current block of samples. That is, the history buffer can represent a delay of one or two processing blocks in sequential processing of sample components of a sample.

With regard to the characteristic of expansion being a missing or lost part of an audio signal, some perceptual audio codecs, including those operating at relatively low bitrates, may cause a perceived narrowing of the stereo soundstage perceived by a listener when the audio signal is produced as an audible sound. That is, sounds which are perceived to be located to the extreme left or right in the original uncompressed audio signal may be attenuated relative to other sounds during the compression process. As a result, the resulting audio signal may be perceived to be more "monophonic" and less "stereophonic". The Soundstage Enhancement module 304 may identify missing or lost parts of the audio signal related to this characteristic in a series of sample components, and amplify signal components which are perceived to be located to the extreme left or right in the input signal (X) as generated signal treatments. For example, the Soundstage Enhancement module 304 may operate to extract extreme left or right signal components and generate a Signal Treatment stream (ST4) containing amplified versions of these signal components. One possible method for extracting extreme left or right signal components is described U.S. patent application Ser. No. 12/897,709 entitled "SYSTEM FOR SPATIAL EXTRACTION OF AUDIO SIGNALS", which is herein incorporated by reference in its entirety.

With regard to the characteristic of reverberation being a missing or lost part of an audio signal, some perceptual audio codecs, including those operating at relatively low bitrates, is that they may cause a perceived reduction in the "ambience" or "reverberation" characteristics in the audio signal. This reduction of reverberation characteristic may result in a perceived "dulling" of the overall sound, as well as a perceived loss of detail in the sound due to the lost part of the audio signal. The reduction of reverberation may also reduce the perceived size and width of the overall sound field. The Reverb Fill module 305 may operate to decompose the input signal (X) into dry and reverberant signal components. The Reverb Fill module 305 may then operate to identify the missing part of the audio signal in a corresponding sample component, increase the perceived level of the reverberation in the sample component, and generate a Signal Treatment stream (ST5) that may contain new reverberant signal components, and may contain amplified reverberant signal components for application to only those sample components of a sequence of samples in which the part of the audio signal is determined to be missing.

A possible method for decomposing the input signal (X) into dry and reverberant signal components is described in U.S. Pat. No. 8,180,067 entitled "SYSTEM FOR SELECTIVELY EXTRACTING COMPONENTS OF AN AUDIO INPUT SIGNAL," and U.S. Pat. No. 8,036,767 entitled "SYSTEM FOR EXTRACTING AND CHANGING THE REVERBERANT CONTENT OF AN AUDIO INPUT SIGNAL," both of which are herein incorporated by reference in their entirety.

With regard to the characteristic of mask signals being a missing or lost part of an audio signal, some perceptual audio codecs, including those operating at relatively low bitrates, may cause a perceived reduction in the clarity and low-level details in the signal. This may be caused by the perceptual audio codec discarding signal components which, according to, for example, a perceptual model, are believed to be inaudible to most listeners. Typically the perceptual model will identify certain first signal components as inaudible if there are other dominant signal components that may mask the first signal components. That is, due to the masking properties of the human auditory system, the dominant signal components may (mask) render the first signal components inaudible. However, each listener's masking properties are somewhat different, and the perceptual model in the perceptual audio codec can only approximate the masking properties of one listener. As a result, the perceptual audio codec may discard certain signal components which are audible to some listeners.

The Masked Signal Fill module 306 may operate to identify the missing parts of the corresponding sample components of an audio signal, and amplify low-level signal components so that they are just at the threshold of being masked. The Masked Signal Fill module 306 may receive the input signal (X) and apply a perceptual model to determine the "simultaneous masking threshold" for each frequency. The simultaneous masking threshold indicates the level at which the perceptual model determines that the signal component at a certain frequency is masked by the signal components at other frequencies. For example, a signal component at 1100 Hz may be inaudible if there is a sufficiently loud signal component at 1000 Hz. In this example, the simultaneous masking threshold indicates the level at which signal components at other frequencies (such as 1100 Hz) will be masked by the signal component at 1000 Hz. Therefore, if the level of the signal component at 1100 Hz falls below the simultaneous masking threshold, then the perceptual model determines that this signal component will be masked (inaudible).

Continuing with this example, if the Masked Signal Fill module 306 determines that the signal component at 1100 Hz falls below the simultaneous masking threshold and thereby identify lost parts of the corresponding sample components of audio signal, the Masked Signal Fill module 306 may generate a Signal Treatment stream (ST6) that may contain an amplified version of the signal component at 1100 Hz such that the signal component at 1100 Hz reaches the simultaneous masking threshold. Similarly, the Masked Signal Fill module 306 may perform this operation for signal components at all frequencies to identify missing parts of corresponding sample components, such that it may generate a Signal Treatment stream (ST6) containing amplified signal components at various frequencies so the signal components at all frequencies may reach the simultaneous masking threshold.

An example of a perceptual model for determining the simultaneous masking threshold is described in U.S. Pat. No. 8,180,067 entitled 'SYSTEM FOR SELECTIVELY EXTRACTING COMPONENTS OF AN AUDIO INPUT SIGNAL,' and U.S. Pat. No. 8,036,767 entitled "SYSTEM FOR EXTRACTING AND CHANGING THE REVERBERANT CONTENT OF AN AUDIO INPUT SIGNAL," both of which are herein incorporated by reference in their entirety. In general, the perceptual model may perform smoothing based on at least one of temporal-based auditory masking estimates, and frequency-based auditory masking estimates during generation of component samples over time (such as over a number of snapshots of a component sample for a series of samples).

The phases of the fundamental and harmonic components of a harmonically rich signal can tend to track each other over time. That is the fundamental and harmonic components of a harmonically rich signal can tend to be aligned in some way. With regard to the characteristic of harmonics phase alignment being a missing or lost part of an audio signal, some perceptual audio codecs, including those operating at relatively low bitrates, may cause the phases of the harmonics of a given sound source to lose their alignment with respect to phase. This loss of phase alignment as a missing part of sample components can occur on at least the higher-order harmonics of a signal. This loss of phase alignment may be perceived by the listener in different ways. One common result of a loss of phase alignment is "swooshing" sound which is typically audible in the higher frequencies. The Harmonic Phase Alignment module 307 may operate to force harmonically related signal components to be phase-aligned over time. The Harmonic Phase Alignment module 307 may analyze the input signal (X) and look for tonal signal components (as opposed to transient or noise-like signal components) and determine if the tonal components are harmonically related. In addition, the Harmonic Phase Alignment module 307 may determine if the phases of any harmonically related tonal components are aligned over time. Where the characteristics in the corresponding sample components are identified as missing part of the audio signal, namely phase alignment of harmonically related tonal components, the phases of any harmonics which are not in alignment may be adjusted. The Harmonic Phase Alignment module 307 may generate a Signal Treatment stream (ST7) that may contain a phase-aligned version of these unaligned tonal components. Alternatively, or in addition, the Harmonic Phase Alignment module 307 may provide some other form of alignment of the tonal components.

If the input signal (X) 104 is stereo or multichannel, then it may be decomposed into spatial slices 501 prior to being processed by the Signal Enhancer 110 as described with reference to FIG. 5. A system and method for decomposing a signal into spatial slices is described in U.S. patent application Ser. No. 12/897,709 entitled "SYSTEM FOR SPATIAL EXTRACTION OF AUDIO SIGNALS", which is herein incorporated by reference in its entirety. Decomposing the input signal into spatial slices may allow more precise application of the various treatments (301, 302, 303, 304, 304, 305, 306, and, 307) to the signal components contained in each of the spatial slices (XSS1, XSS2, XSS3, . . . , XSSn) 501. For example, if a transient signal is located within a given spatial slice, then the Transient Enhancement treatment 303 may only be applied in that spatial slice, while not affecting the non-transient signal components in the other spatial slices.

Once the appropriate treatments have been applied to each of the spatial slices, the enhanced output streams (YSS1, YSS2, YSS3, . . . , YSSn) 502 from each of the spatial slices may be combined at a summing module 503 to produce the composite output signal (Y) on the output line 105.

The various treatments applied to the signal components in a given spatial slice may vary over time as the content of the input signal (X) changes. Using the above example, the Transient Enhancement treatment 303 may only be applied to some of the sample components in a given spatial slice during times when a transient signal component has been detected in that spatial slice.

Audio signals such as music or speech typically contain some amount of reverberation. This reverberation may be due to the room (e.g. a concert hall) in which the audio signal was recorded, or it may be added electronically. The source of the reverberation is referred to as a reverberant system. The characteristics of the reverberation are determined by the impulse response of the reverberant system. The impulse response of the reverberant system can be divided into a set of blocks. The Impulse Response Estimator 910 operates on the input signal to produce a perceptually relevant estimate of the frequency domain representation of the impulse response. Generally, the impulse response estimator may operate on the input signal to produce a block-based estimate of the impulse response. The block-based estimate of the impulse response consists of a plurality of block estimates which correspond to frequency domain estimates of the impulse response.

Figure 6:
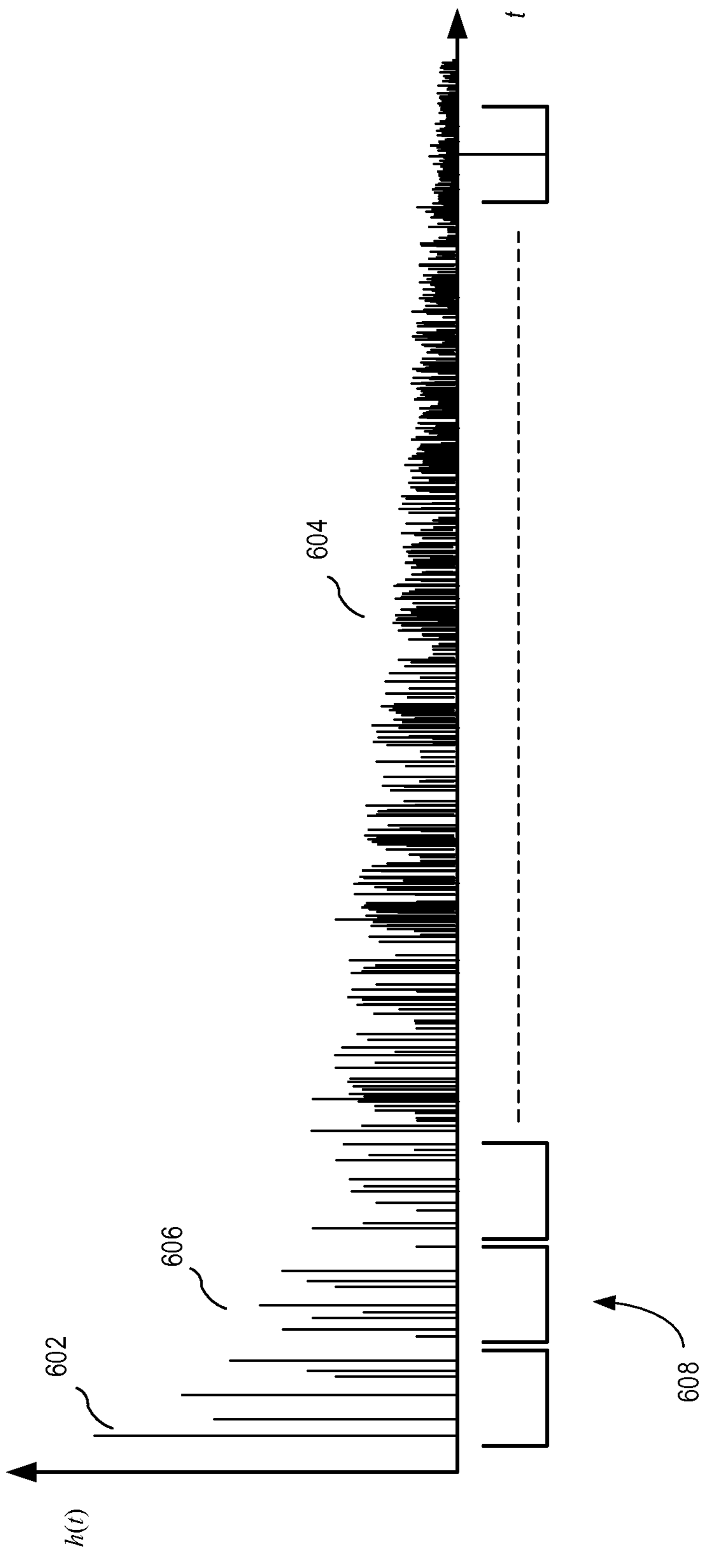
FIG. 6 depicts the components of an example impulse response with representation of block-based decomposition.

FIG. 6 is an example of an impulse response. The first vertical line represents a direct sound component 602 while the remaining lines represent reflections. The height of each line indicates its amplitude and its location on the time axis (t) indicates its time-of-arrival at a sound measurement device, such as a microphone. As time goes on, the number of reflections increases to the point where it is no longer possible to identify individual reflections. Eventually the reflections evolve into a diffuse exponentially decaying system. This is typically referred to as the reverberant tail 604 of the impulse response.

The so-called early reflections 606 arrive soon after the direct sound component 602 and have a different perceptual effect than the reverberant tail. These early reflections provide perceptual cues regarding the size of the acoustic space and the distance between the source of the audio signal and the microphone. The early reflections 606 are also important in that they can provide improved clarity and intelligibility to a sound. The reverberant tail also provides perceptual cues regarding the acoustic space.

An impulse response can also be viewed in the frequency domain by calculating its Fourier transform (or some other transform), and so a reverberant system can be described completely in terms of its frequency domain representation $H(\omega)$. The variable $\omega$ indicates frequency. The Fourier representation of the impulse response provides both a magnitude response and a phase response. Generally speaking the magnitude response provides information regarding the relative levels of the different frequency components in the impulse response, while the phase response provides information regarding the temporal aspects of the frequency components.

The Reverb Fill Module 305 may produce a frequency domain estimate of the estimate of the magnitude of the reverberant energy in the input signal. This estimate of the magnitude of the reverberant energy is subtracted from the input signal, thus providing an estimate of the magnitude of the dry audio signal component of the input signal. The phase of the reverberant input signal is used to approximate the phase of an original dry signal. As used herein, the term "dry signal," "dry signal component," "dry audio signal component," or "direct signal component" refers to an audio signal or a portion of an audio signal having almost no reverberant energy present in the audio signal. Thus the original dry signal may have almost no reverberant energy since it consists almost entirely of the direct sound impulse 602. As used herein, the terms "reverberant energy," "reverberant input signal," "reverberant component," "reverberant signal component," "reverberation component," or "reverberation signal component" refer to the early reflections, and the reverberant tail of an audio signal. In addition, with respect to audio signals, as used herein, the term "component" or "components" refer to one or more components.

If the phase of the reverberant input signal is used to approximate the phase of an original dry signal using the entire impulse response as a whole, then it is likely that severe time-domain artifacts would be audible in the processed signal. Therefore, the Reverb Fill Module 305 can divide the estimate of the overall impulse response into blocks 608, and processing can be performed in a block-based manner. The pre-determined length of the blocks 608 can be short enough that the human ear does not perceive any time-domain artifacts due to errors in the phase of the processed output signals.

Two factors combine to determine the rate at which a reverberant input signal decays at a given frequency. The first factor is the rate of decay of the dry (i.e. non-reverberant) sound source, and the second is the rate of decay of the reverberant system. While the rate of decay of the reverberant system at a given frequency is relatively constant over time, the rate of decay of the dry sound source varies continuously. The fastest rate of decay that is possible for the input signal (X) occurs when the dry sound source stops at a given frequency, and the decay of the signal is due entirely to the decay of the reverberant system. In the example of FIG. 6, the dry sound source may stop at the time of early reflections 606, for example. The rate of decay of the reverberant system at a given frequency can be determined directly by the impulse response of the reverberant system at that frequency. Therefore, the input signal (X) should not decay at a rate that is faster than the rate dictated by the impulse response of the reverberant system.

Figure 7:
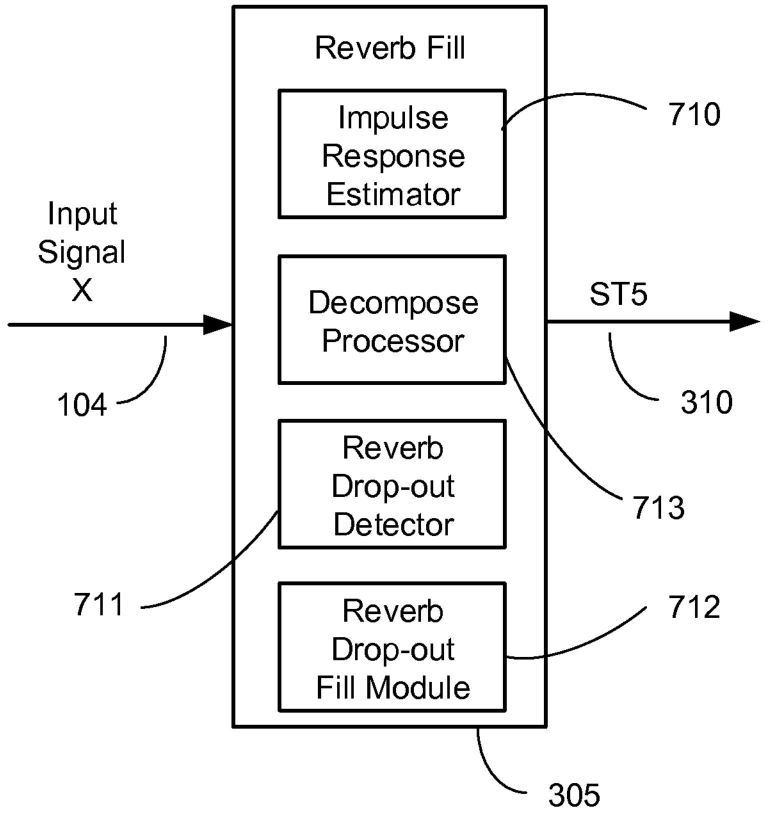
FIG. 7 is an example block diagram of the Reverb Fill module illustrated in FIG. 3.

FIG. 7 shows a more detailed view of the Reverb Fill module 305. The Reverb Fill module 305 receives the input signal (X) 104 and may provide a signal treatment 310 ST5 as an output. An Impulse Response Estimator 710, a Reverb Drop-out Detector Module 711 and a Reverb Drop-out Fill Module 712, and a Decompose Processor module 713 may be included in the Reverb Fill module 305. In other examples, fewer or greater numbers of modules may be described to accomplish the functionality discussed.

The Impulse Response Estimator 710 may be used to derive an estimate of the impulse response of the reverberant system of the input signal (X). One possible method for estimating the impulse response of a reverberant system of an input signal (X) is described in U.S. Pat. No. 8,180,067 entitled "SYSTEM FOR SELECTIVELY EXTRACTING COMPONENTS OF AN AUDIO INPUT SIGNAL," and U.S. Pat. No. 8,036,767 entitled "SYSTEM FOR EXTRACTING AND CHANGING THE REVERBERANT CONTENT OF AN AUDIO INPUT SIGNAL," both of which are herein incorporated by reference in their entirety.

Figure 8:
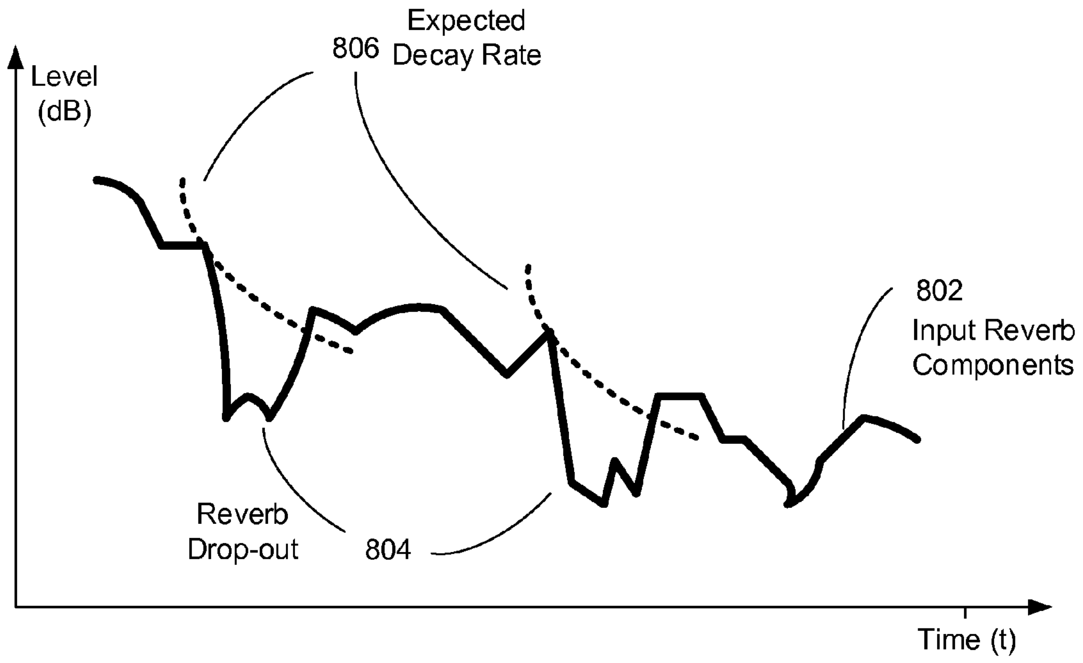
FIG. 8 is an example estimate of sample components of an input reverberation series of samples at a given frequency.

FIG. 8 is an example of an estimate of a reverberation component of an audio signal that can be estimated by the Reverb Fill module 305. The Decompose Processor module 713 may operate on the input signal (X) to derive an Input Reverb Component 802, which is one of the previously discussed sample components of the input signal. The Input Reverb Component 802 may consist of an estimate of the reverberant component (reverberation) or characteristic of the input signal. One possible method for deriving the Input Reverb Component 802 of an input signal (X) is described in U.S. Pat. No. 8,180,067 entitled "SYSTEM FOR SELECTIVELY EXTRACTING COMPONENTS OF AN AUDIO INPUT SIGNAL," and U.S. Pat. No. 8,036,767 entitled "SYSTEM FOR EXTRACTING AND CHANGING THE REVERBERANT CONTENT OF AN AUDIO INPUT SIGNAL," both of which are herein incorporated by reference in their entirety. An Expected Decay Rate 806 may be directly determined for each sequential sample from the impulse response by the Decompose Processor module 713. In FIG. 8, the Input Reverb Component 802 is illustrated as a sequence of sample components at a given frequency over a period of time (t). It can be seen that the Input Reverb Component 802 grows (increases) at some points in time and decays at other points in time.

Referring to FIGS. 7 and 8, the Reverb Drop-out Detector 711 may compare the decay rate of the Input Reverb Component 802 to the Expected Decay Rate 806 at different points in time. The Reverb Drop-out Detector 711 may identify in the individual sample components one or more Reverb Drop-outs 804 as missing or lost parts of the audio signal, where the Input Reverb Component 802 falls below the Expected Decay Rate 806. The Reverb Drop-out Fill Module 712 may operate to produce a reverb fill treatment, as a signal treatment to compensate for the lost energy due to the Reverb Drop-out 804. As illustrated in FIG. 8, the signal treatment is only applied to those sample components in which part of the audio signal is missing. Accordingly, as a sequence of sample components are being sequentially processed, the signal treatment may be selectively applied to only those sample components identified as having missing or lost parts of the input signal.

Figure 9A:
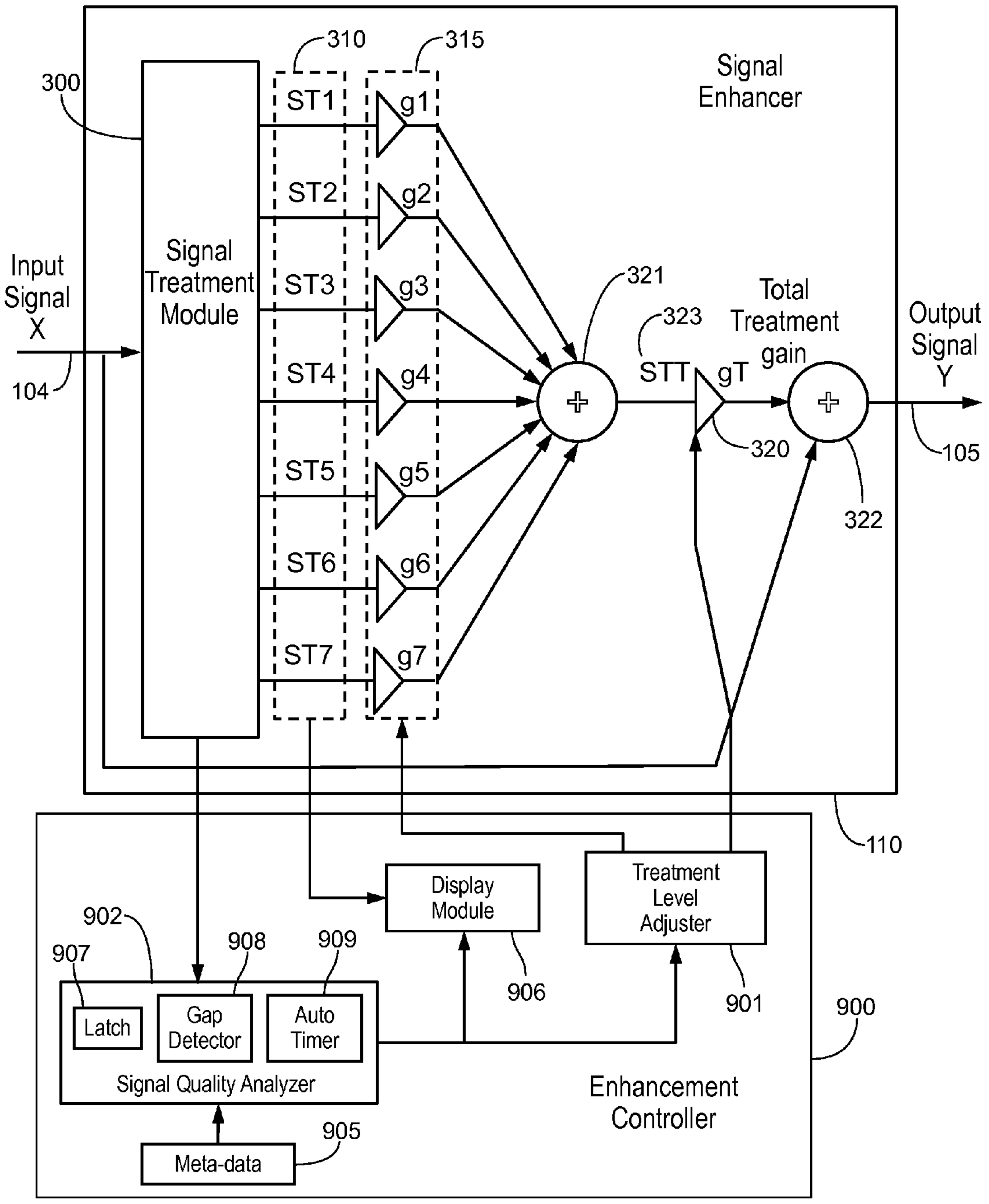
FIG. 9*a* is an example block diagram of the Signal Quality Analyzer, the Treatment Level Adjuster, and the Display Module.

FIG. 9*a* is a block diagram example of the Signal Enhancer module 110 coupled with an Enhancement Controller Module 900. The Enhancement Controller Module 900 may include a Treatment Level Adjuster module 901, a Signal Quality Analyzer module 902, and a Display module 906. During operation, the Signal Treatment Module 300 may provide Treatment Requirement Indicators to the Signal Quality Analyzer 902. The Treatment Requirement Indicators can provide relevant information from the various treatment modules (301, 302, 303, 304, 305, 306, and 307) regarding the amount of signal treatment that is required due to identified missing parts of the input signal (X).

As one example of a possible Treatment Requirement Indicator, the Bandwidth Extension module 301 (FIG. 3) may provide an estimate of the cut-off frequency (Fx) of the input signal (X). The cut-off frequency may sometimes be referred to as a brickwall or brickwall frequency due to its appearance in a frequency spectrum graph. The brickwall may indicate a hard, steep cutoff frequency introduced by compression, typically in the 10-19 kHz region. Above the cut-off frequency point there is substantially no information in the input signal (X). Depending on the type of compression used, or differences in the compression used, the frequency of the brickwall can vary per track or even disappear temporarily during a track. Lower values for the cut-off frequency may suggest that the Perceptual Audio Encoder 101 acted more aggressively on the Original Audio Signal (Z) 100 (FIG. 1), and therefore the Input Signal (X) may be missing a significant portion of the high frequency part of the signal resulting in poorer perceived quality by a listener if the audio signal were played back. Alternatively, or in addition, the Bandwidth Extension treatment module 301 may provide an estimate of the ratio of the missing energy of the signal above the cut-off frequency that was discarded by the Perceptual Audio Encoder 101 versus the energy of the signal that was retained. Larger values for this ratio may suggest that a more significant portion of the Original Audio Signal (Z) 100 is missing (was discarded) and therefore the Input Signal (X) may have poorer perceived quality by a listener if the audio signal were played back.

As another example, the Inband Harmonic Fill module 302 (FIG. 3) may provide an indication of how frequently middle (inband) harmonics have been discarded and are missing from the audio signal. Alternatively, or in addition, the Inband Harmonic Fill module 302 may provide an estimate of the energy of the discarded harmonics. Greater levels of missing (discarded) inband harmonic energy may indicate that the input signal (X) has poorer perceived quality by a listener if the audio signal were played back.

As another example, the Reverb Fill module 305 may provide a measure of the reverberant energy in the input signal (X), as well as an estimate of the lost reverberant energy that was discarded by the Perceptual Audio Encoder 101. Greater levels of missing reverberant energy may indicate that the input signal (X) has poorer perceived quality by a listener if the audio signal were played back.

As yet another example, the Soundstage Expansion module 304 (FIG. 3) may provide an estimate of the amount of missing or lost Side (left minus right) energy and Mid (left plus right) energy that was discarded by the Perceptual Audio Encoder 101. Alternatively, or in addition, the Soundstage Expansion module 304 may provide a measure of the energy of extreme left or right signal components relative to the total energy of the input signal (X). Lower levels of extreme left or right signal energy may indicate that parts are missing from the input signal 104 resulting in poorer perceived quality by a listener if the audio signal were played back.

As another example, the Transient Enhancement module 303 may provide an indication of missing parts of the audio signal by indicating how frequently transients occur in the input signal (X) 104. As another example, the Masked Signal Fill 306 module may examine the input signal (X) and provide an indication of how frequently signal components that fell below the simultaneous masking threshold were discarded and are therefore missing from the audio signal. If signal components are frequently missing (discarded) then this may indicate that the input signal (X) may have poorer perceived quality by a listener if the audio signal were played back.

As another example, the Harmonic Phase Alignment module 307 (FIG. 3) may examine the input signal (X) and provide an indication of how frequently harmonically related signal components are not phase-aligned. Alternatively, or in addition, the Harmonic Phase Alignment module 307 may provide a measure of the energy of the harmonic components that are not phase aligned. Higher levels of harmonic components that are not phase-aligned may suggest that parts of the input signal (X) 104 are lost, which may have poorer perceived quality by a listener if the audio signal were played back.

The Signal Quality Analyzer 902 may receive the Treatment Requirement Indicators and derive Signal Quality Indicators. Alternatively, or in addition, the Signal Quality Analyzer 902 may receive Meta-data from a meta-data buffer 905. The Meta-data may provide a direct indication of the perceived quality of the input signal (X). The Meta-data included in the meta-data buffer 905 may be provided by the Perceptual Audio Decoder 103, the audio signal, or some other source. Alternatively, the meta-data may be provided directly to the Signal Quality Analyzer 902, and the meta-data buffer 905 may omitted. The Meta-data may provide information regarding the origin and characteristics of the input signal including but not limited to the cut-off frequency (Fx), the length of the current processing block used by the Perceptual Audio Encoder 101, the bitrate of the input signal (X), and/or the sampling rate of the input signal (X).

Using one or more of the received Treatment Requirement Indicators and/or the Meta-data, the Signal Quality Analyzer 902 may derive an estimate of the perceived overall quality of the input signal (X). Alternatively, or in addition, Signal Quality Analyzer 902 may derive estimates of the perceived quality of the input signal with respect to the individual signal treatments.

The relative energy levels of the Signal Treatments 310 that the Signal Enhancer module 110 applies to the input signal (X) may be varied depending on the relative quality of the input signal and/or the sample components of the input signal. For example, in situations where the quality of the input signal (X) is relatively good, then the relative energy levels of the Signal Treatments 310 may be reduced. Similarly, in situations where the quality of the input signal (X) is relatively poor, then the relative energy levels of the Signal Treatments 310 may be correspondingly increased. The Treatment Level Adjuster 901 may independently alter the relative energy levels of the Signal Treatments 310 by increasing or decreasing one or more of the treatment gains (g1, g2, g3, g4, g5, g6, and g7) 315. Alternatively, or in addition, the Treatment Level Adjuster 901 may alter the total relative energy level of the Signal Treatments 310 by increasing or decreasing the total treatment gain (gT) 320.

The Treatment Level Adjuster 901 may receive as parameters one or more Signal Quality Indicators from the Signal Quality Analyzer 902. The Treatment Level Adjuster 901 may use one or more of the available Signal Quality Indicators 903 to independently determine the appropriate values for each of the individual treatment gains (g1, g2, g3, g4, g5, g6, and g7) 315, as well as the appropriate value for the total treatment gain (gT) 320. Alternatively, or in addition, the Signal Quality Analyzer 1002 may use Meta-data that may provide a direct indication of the perceived quality of the input signal (X) to determine the appropriate values for each of the individual treatment gains (g1, g2, g3, g4, g5, g6, and g7) 315, as well as the appropriate value for the total treatment gain (gT) 320. In this way, the levels of the various Signal Treatments 310 may be automatically adjusted to match the requirements of the input signal (X).

In some cases, Meta-data regarding the input signal (X) may be unavailable. Accordingly, the Signal Quality Analyzer 902 may utilize a compression detection and treatment algorithm that automatically readjusts the treatment levels per stream or per track. The treatment algorithm may include a Gap Detector 907, a Latch 908, and an Auto Timer 909. The Gap Detector 907 may be configured to identify gaps of silence between tracks, as well as the outset of new tracks or audio signals. The Latch 908 may be configured to selectively lock the individual treatment gains (g1, g2, g3, g4, g5, g6, and g7) 315 and the total treatment gain (gT) 320 when certain conditions are met. When a track is identified as "compressed", the levels of the various Signal Treatments 310 are set (i.e., latched) and remain within a narrow range until the next track. This prevents pumping or variable sound. If the Gap Detector 907 detects a gap (e.g., mute or track change), the Signal Quality Analyzer 902 will reset the Latch 908 and set the levels of the various Signal Treatments 310 to none. When audio resumes within the input signal (X), the compression detection mechanism will again look for compression (brickwall).

The Auto Timer 909 may be configured to reset when a new stream or track is detected by the Gap Detector 907, and count down a predetermined amount of time at the beginning of the audio during which treatment gains may be adjusted. Accordingly, the Auto Timer 909 may be configured to avoid audible changes in a level of applied treatment in the middle of an audio stream or track. In some examples, when no compression is detected within a predetermined amount of time (e.g., 5 seconds), the levels of the various Signal Treatments 310 may remain at none until the next gap is detected. This avoids unexpected spectral change in the middle of a track due to sudden appearance of high frequencies.

The Treatment Level Adjuster module 901 may also consider other parameters when determining the individual treatment gains and the total treatment gain. Thus, for example, certain of the individual treatment gains may be decreased and certain other of the individual treatment gains may be increased by the Treatment Level Adjuster module 901 based on the parameters. Such parameters may include metadata of the input signal, such as a genre of the audio signal be produced, such that, for example, for a rock music genre the transient treatment level gain may be increased to emphasize drums, and classical music genre, the reverberation treatment level gain may be increased to emphasize the music hall effect. In another example, treatment gains may be adjusted when the input signal is talk versus music. Any number of treatment level gains and parameters may be used in other examples. The gain adjustments by the Treatment Level Adjuster module 901 may also be rules based, such as when there is treatment of the characteristic of reverberation above a predetermined threshold, gain for the characteristic of transient enhancement may be correspondingly reduced based on, for example a ratio. User settings may also be applied to the Treatment Level Adjuster module 901 to effect the amount of treatment gains that are selectively applied under certain conditions or modes of operation.

Figure 9B:
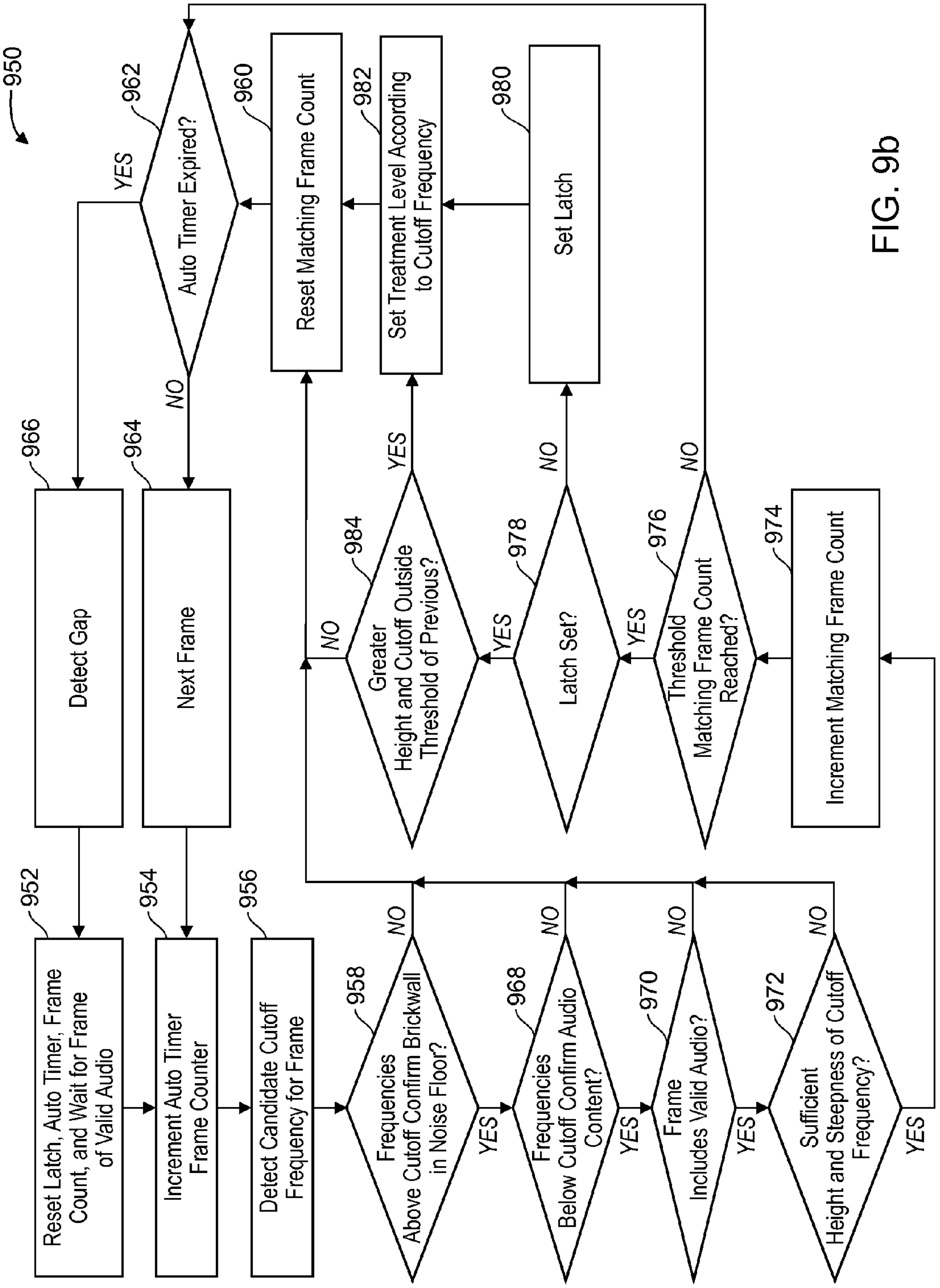
FIG. 9*b* is an example block diagram of a process of a compression detection and treatment algorithm that automatically readjusts the amount of treatment gain per stream or per track.

FIG. 9*b* is an example block diagram of a process 950 of a compression detection and treatment algorithm that automatically readjusts the amount of treatment gain per stream or per track. The process 950 may be performed, for example, by the Signal Quality Analyzer 902 of the Signal Enhancer module 110 of the Enhancement Controller Module 900. The process 950 may be used to allow the Signal Quality Analyzer 902 to automatically set the individual treatment gains (g1, g2, g3, g4, g5, g6, and g7) 315 and the total treatment gain (gT) 320 to levels appropriate for the level of compression of the input signal (X), even if no Meta-data information regarding the quality of the input signal (X) is available. In an example, to perform the compression detection, the Signal Quality Analyzer 902 may operate upon frequency bins after a 512 or 1024-point FFT. The examples below assume a 1024-point FFT and 44.1 kHz sampling rate, but it should be noted that other point level FFTs and sampling rates may be utilized as well.

Generally, the process 950 may sample a wide collection of arbitrary bins from the direct FFT input so that the monitored information is fast and up-to-date, and may compare this information to a constant gap threshold. If the average energy is less than the predetermined threshold, the process 950 may determine the input signal (X) to a mute or track change. Otherwise, process 950 proceeds to looking backwards from the Nyquist frequency at the bin energy to see if there is a significant rise in energy at a candidate frequency. The process 950 may attempt to pinpoint the top of the rise and use this point for several measurements. Above this point is considered the Noise Floor and below is the Signal Floor. The process 950 may perform several checks on the candidate cutoff frequency to see if it looks like enough like a brickwall, there is not significant information happening above it, and it is not just a random fluke harmonic or spike in the high frequencies. If the candidate cutoff frequency survives all the tests, it must pass them all for at least a predetermined number of frames in a row (e.g., 20 consecutive frames in an example). At this point, treatment of the input signal (X) may begin ramping up. The treatment may be proportional to the cutoff frequency, such that a lower cutoff means more treatment is applied to the input signal (X). The level of treatment may persist until the track ends (or is muted). A new cutoff frequency may supersede a previously determined cutoff frequency under various conditions, such as if the new cutoff frequency is determined to be greater than a predetermined percentage different (e.g., at least 5 percent different) and with a greater brickwall height. These conditions may accordingly prevent undesirable artifacts from constantly varying treatment levels.

More specifically, at operation 952 the Signal Quality Analyzer 902 initializes the compression detection and treatment algorithm. For example, the Signal Quality Analyzer 902 may reset the Latch 908, may set the individual treatment gains 315 and total treatment gain 320 to no gain, and may also reset the Auto Timer 909. The Signal Quality Analyzer 902 may further wait for a Frame of valid audio. This monitoring may be performed, for example, by looking at the instantaneous value of a set of arbitrary bins in the 200 Hz-4 kHz region of the input signal (X). The Signal Quality Analyzer 902 may confirm that a smoothed sum of these bins exceeds a pre-determined constant level of energy to determine that a new track or stream has begun. If audio has begun, control passes to operation 954.

At operation 954, the Signal Quality Analyzer 902 increments the Auto Timer 909. In an example, the Auto Timer 909 may specify an amount of time at the beginning of the track or audio during which automatic adjustments to the treatment gains 315, 320 may be performed. When the Auto Timer 909 expires, no further automatic adjustments may be performed until the next detected gap. The Signal Quality Analyzer 902 may increment the Auto Timer 909 (if enabled) at operation 954 for each frame of valid audio after the detected gap.

At operation 956, the Signal Quality Analyzer 902 detects a candidate cutoff frequency for the input signal (X). In an example, the Signal Quality Analyzer 902 scans frequency bins downwards from 19 kHz to 8 kHz to locate a significant rise in signal energy (e.g., at least a 4× rise in energy in the space of 1 FFT frequency bin). If a rise in signal energy is found, the Signal Quality Analyzer 902 may further locate the bin at which energy stops rising (e.g., where the energy stops rising at a rate of greater than 10% per bin). This bin where the energy stops rising may be referred to as the candidate BinX or the cutoff frequency.

At operation 958, the Signal Quality Analyzer 902 determines whether the frequencies of the input signal (X) above the cutoff frequency confirm the cutoff. In an example using a 1024 point FFT, the Signal Quality Analyzer 902 scans the frequency bins starting at 11 bins above the BinX cutoff frequency up to 19 kHz to determine if the noise floor holds any information. If the noise floor holds information, then that may indicate that the cutoff is not a true compression-induced brickwall. As a more specific example, if the noise floor rises more than 5% within 2 consecutive bins, the BinX cutoff frequency candidate fails. If the candidate passes, control passes to operation 968 to continue to evaluate the candidate brickwall frequency. If the candidate fails, control passes to operation 960.

At operation 960, the Signal Quality Analyzer 902 resets the number frames matching the candidate cutoff frequency to none. At operation 962, the Signal Quality Analyzer 902 determines whether the Auto Timer 909 has expired and no further automatic adjustments may be performed. If the Auto Timer 909 has not expired, control passes to operation 964 to process a next frame of the input signal (X). After operation 964, control passes to operation 954 to continue processing the audio. If the Auto Timer 909 has expired, control passes to operation 966 to wait for a gap identifying the next audio track or sound. Gap detection may be performed similar to the audio detection described above with respect to operation 952, such that when certain bins no longer exceed a pre-determined constant level of energy, the Signal Quality Analyzer 902 may identify a gap. When the gap is detected, control passes from operation 966 to operation 952 to restart the automatic treatment level determination process.

At operation 968, the Signal Quality Analyzer 902 determines whether the frequencies of the input signal (X) below the cutoff frequency confirm the cutoff. In an example using a 1024 point FFT, the Signal Quality Analyzer 902 scans frequency bins starting at BinX-1 down to BinX-100 to locate an energy drop of more than five times. If such an energy drop is located found, then the candidate BinX may likely only be a narrow harmonic spike and not a true brickwall, and the candidate fails. If the candidate passes without detection of the energy drop below the candidate frequency, control passes to operation 970. If the candidate fails, control passes to operation 960.

At operation 970, the Signal Quality Analyzer 902 determines that the input signal (X) contains valid audio. This may be performed, for example, to ensure that the overall signal energy is above a pre-determined threshold sufficient for the brickwall detection to be meaningful. In many examples, the detection of sufficient energy may be similar to or identical to the determination performed at operation 952 to identify audio in the input signal (X) indicative of an end of a detected gap. If the input signal (X) passed the validity test, control passes to operation 972. Otherwise, control passes to operation 960.

At operation 972, the Signal Quality Analyzer 902 determines whether the height and steepness of the candidate brickwall is above a pre-determined threshold. In an example, the Signal Quality Analyzer 902 may confirm steepness by ensuring that the candidate brickwall has at least 2.5× as much energy as the next bin. The Signal Quality Analyzer 902 may confirm height by ensuring that the current candidate brickwall is at least as high as any previously confirmed candidate brickwalls for the same audio track. If the candidate passes, control passes to operation 974. If the candidate fails, control passes to operation 960.

At operation 974, the Signal Quality Analyzer 902 increments the matching frame count. The matching frame count may accordingly indicate the number of frames that have successfully met all the criteria for the current candidate brickwall at BinX.

At operation 976, the Signal Quality Analyzer 902 determines whether the matching frame count has reached a predetermined threshold count. In an example, the predetermined threshold count may be 20 consecutive frames. If the matching frame count has reached the predetermined threshold count, then the candidate may be considered to be correct, and control may pass to operation 978. Otherwise, control passes to operation 962.

At operation 978, the Signal Quality Analyzer 902 determines whether the Latch 908 has been set. The Latch 908 may have previously been set, for example, by earlier successful determination of a candidate brickwall previous. If the Latch 908 is unset, control passes to operation 980. If the Latch 908 is already set, control passes to operation 984.

At operation 980, the Signal Quality Analyzer 902 sets the Latch 908, and at operation 982, the Signal Quality Analyzer 902 sets the treatment gains 315 and total treatment gain 320 in accordance with the frequency of the brickwall BinX. In an example, the treatment level is a percentage based on the brickwall frequency (i.e., where a lower cutoff frequency provides for a higher level of treatment). The treatment gains 315 may set such that the treatment may be mixed in with the original audio stream at a strength equal the this percentage, and the total treatment gain 320 for the combined output may be scaled relative to treatment level; i.e., higher treatment values receive more scaling than lower treatment values, and audio which is not compressed is not scaled. Accordingly, when the Latch 908 is set, the treatment gains 315, 320 are fixed at levels determined according to the brickwall frequency. After operation 982, control passes to operation 960 to continue brickwall detection for the audio.

At operation 984, the Signal Quality Analyzer 902 determines whether the candidate brickwall is of a greater height than a previously established cutoff frequency for the track, or also if the candidate brickwall is within a predetermined threshold frequency of the previously established cutoff frequency. In an example, the process 950 continues so long as the Auto Timer 909 has not expired, so that if a better brickwall is detected before the Auto Timer 909 expires, that better brickwall may instead be used for latching of the treatment gains 315, 320. In an example, the better brickwall may be required to be of a brickwall height higher than the previous cutoff frequency, and be more than 5% different in frequency to supplant the previous cutoff frequency.

The Display Module 906 may provide a visual representation of the quality of the input signal (X), the output signal (Y), as well as different aspects of performance and/or operation of the Signal Enhancer module 110. As shown in FIG. 9, the Display Module 906 may receive and display one or more of the Signal Treatments (ST1, ST2, ST3, ST4, ST5, ST6, and ST7) 310. For example, the Display Module 906 may display the Signal Treatment ST1 due to the Bandwidth Extension module 301. In this case, the Display Module 906 may produce a visual display of a spectral representation of the new signal components above the cut-off frequency (Fx) which have been generated by the Bandwidth Extension module 301. Alternatively, or in addition, the Display Module 906 may display a spectral or time domain representation of the output signal (Y) which includes all of the applied Signal Treatments 310. Alternatively, or in addition, the Display Module 906 may receive one or more Signal Quality Indicators from the Signal Quality Analyzer 902. The Display Module 906 may in turn produce a visual representation of the quality of the input signal (X). The Display Module 906 may also produce a visual representation of the overall level of the Signal Treatments 310 being applied to the input signal (X). The Display Module 906 may also produce a visual representation of the quality of the output signal (Y). Thus, a user viewing the display may be provided a visual indication of the quality of the input signal (X), and also the extent to which, or level, that the treatment signals are being applied.

Figure 10:
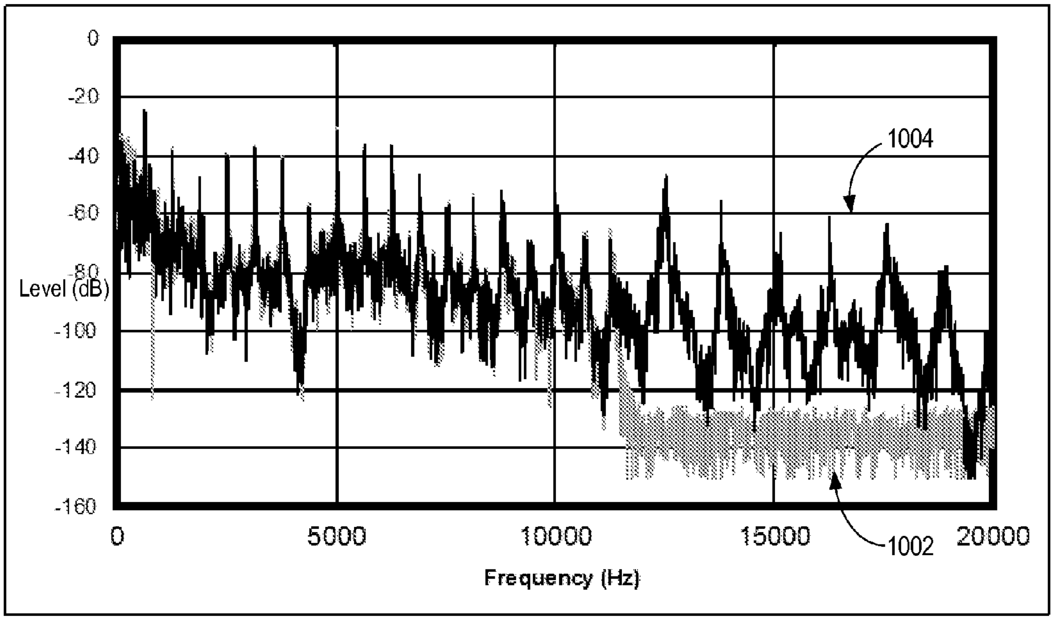
FIG. 10 is an example display of an output signal with bandwidth enhancement signal treatment.

FIG. 10 is an example display of an output signal (Y) in which the signal treatment of bandwidth enhancement is indicated. In FIG. 10, above a cutoff frequency of about 12 kHz, a portion of an input signal (X) 1002 has been discarded during previous encoding, as indicated by the portion of the input signal (X) 1002 being in a range of −120 to −150 dB. The Bandwidth Extension module 301 may identify parts of the audio signal are missing or lost and provide a signal treatment 1004 over the same range of frequencies. The signal treatment 1004 can be applied to the untreated part of the input signal (X) 1002. Accordingly, a user can view a display and be provided with an indication of not only the quality of what the untreated output signal would have looked like, but also the level and extent of treatment being provided by the signal enhancer system 110. In other examples, other forms of displays may be created to indicate any of one or more treatments being applied.

Figure 11A:
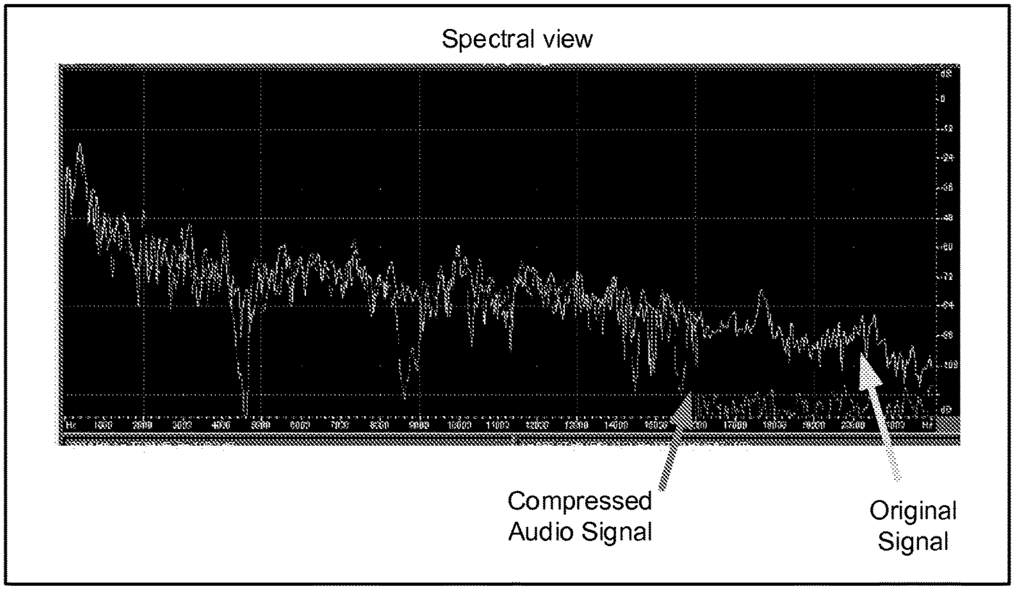
FIGS. 11*a* and 11*b* depict example spectral views (frequency-domain) to illustrate compression by the Signal Enhancer system.
Figure 11B:
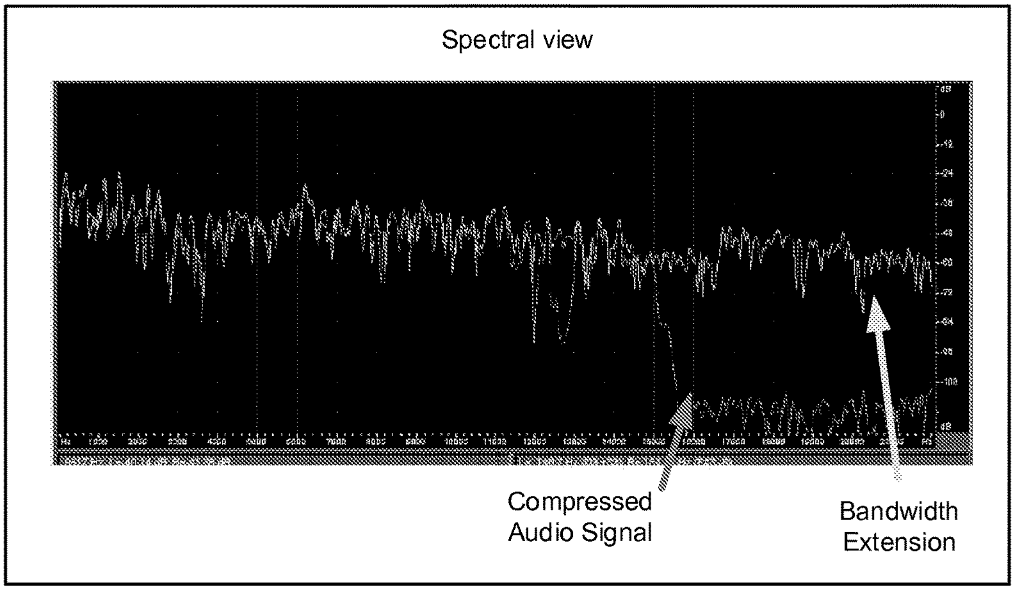

FIGS. 11*a* and 11*b* illustrate example results of the operation of the Bandwidth Extension module 301. FIG. 11*a* shows a spectral view (frequency-domain) of a short block of an audio signal before and after it has been compressed by a perceptual audio codec. The curve of the original signal is shown, where it can be seen that significant signal energy continues up to the Nyquist frequency. The compressed audio signal curve shows this same signal after it has been compressed by a perceptual audio codec. In FIG. 11*a*, it can be seen that, above a certain cut-off frequency (Fx), the signal components have been discarded, and what remains is simply low-level noise.

FIG. 11*b* shows a spectral view of an example of a short block of a compressed audio signal before and after it has been processed by the Bandwidth Extension module 301. Here the compressed audio signal is illustrated with the signal components above the cut-off frequency (Fx) discarded. The curve of the same compressed audio signal after it has been processed by the Bandwidth Extension module 301 is included in FIG. 11*b*. It can be seen that new signal components have been generated above the cut-off frequency (Fx). These new signal components have been generated based on, and/or using at least some of the signal components below the cut-off (Fx).

Figure 12A:
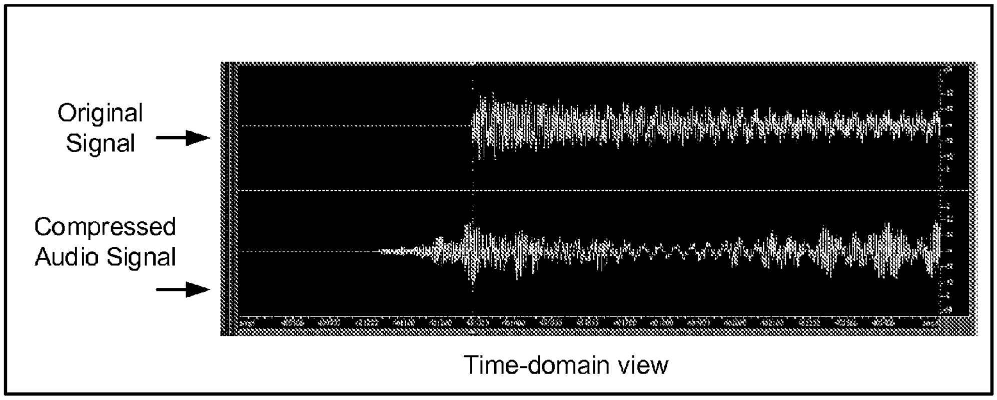
FIGS. 12*a* and 12*b* depict example spectral views to illustrate transient enhancement by the Signal Enhancer system.
Figure 12B:
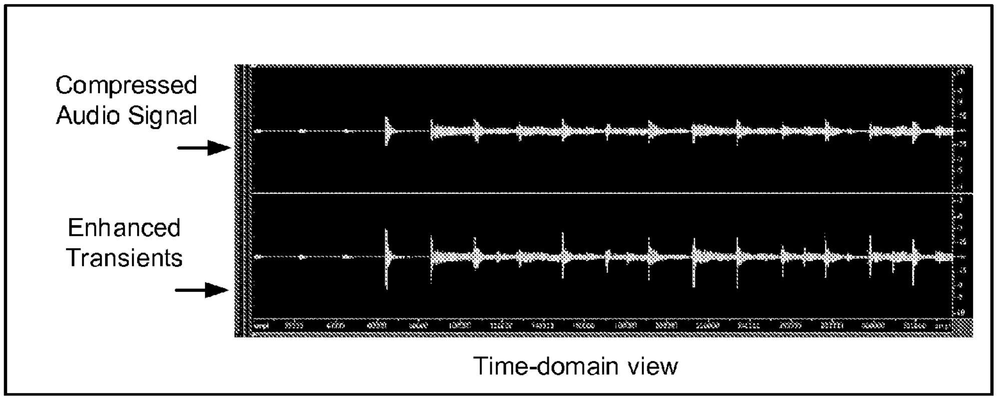

FIGS. 12*a* and 12*b* illustrate example operation of the Transient Enhancement module 303. FIG. 12*a* shows a time-domain view of a transient signal component. The upper panel of FIG. 12*a* shows the original signal. It can be seen that the start signal is nearly silent and is followed by a sharp transient signal, which decays over time. The lower panel of FIG. 12*a* shows a similar transient signal component after it has been compressed by a perceptual audio codec. It can be seen that the transient is no longer sharply defined. Moreover, the compressed audio signal now has energy arriving before the actual transient. This is an example of the so-called "pre-echo" which was described earlier.

FIG. 12*b* shows a time-domain view of an example transient signal component before and after it has been processed by the Transient Enhancement module 303. The upper panel of FIG. 12*b* shows a compressed audio signal having numerous transients over time. It can be seen that the transients are not very pronounced in the signal. The lower panel of FIG. 12*b* shows the same transient signal after it has been processed by the Transient Enhancement module 303, where the onsets of the individual transients are now sharply defined and easily visible.

Figure 13:
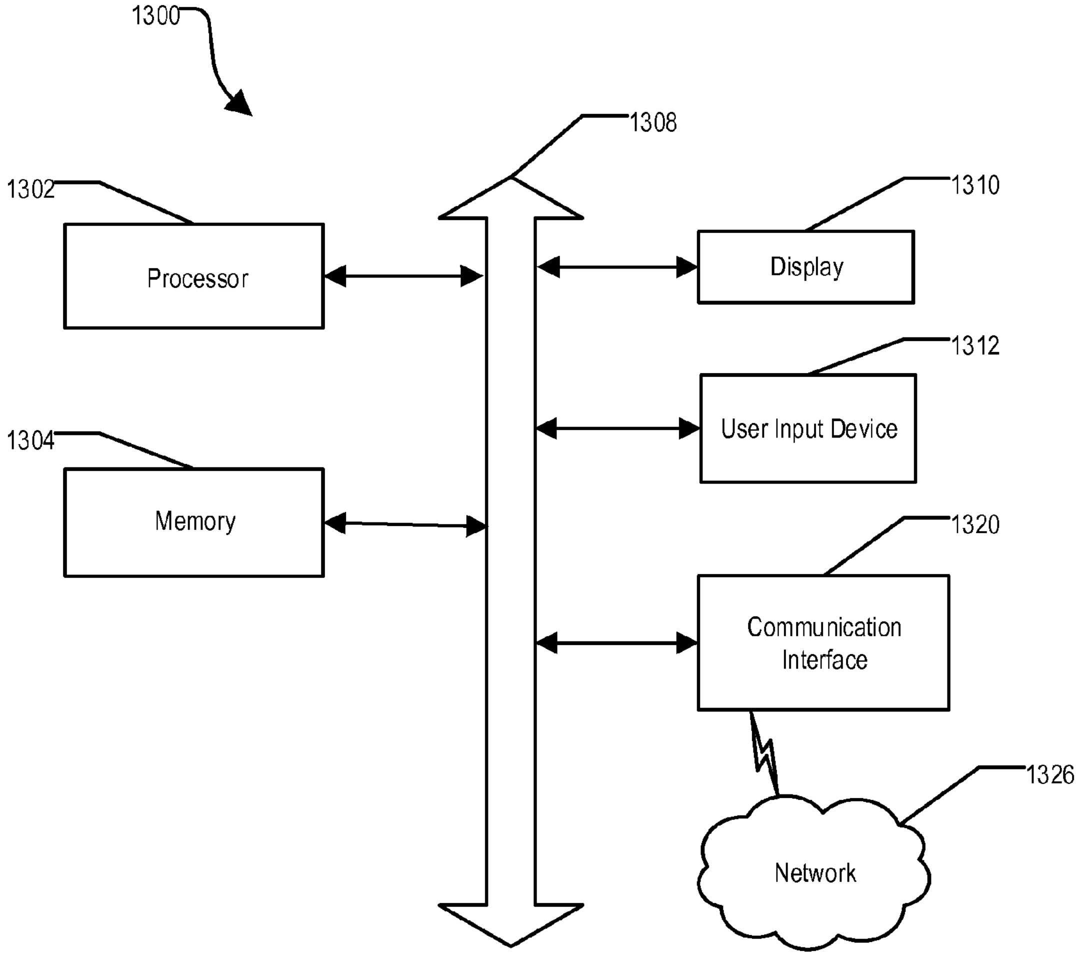
FIG. 13 is an example computing system.

FIG. 13 is an example computing system 1300. The computer system 1300 may include a set of instructions that can be executed to cause the computer system 1300 to perform any one or more of the methods or computer based functions described. The computer system 1300 may operate as a standalone device, may be part of another device, or may be connected, such as using a network, to other computer systems or peripheral devices.

In a networked deployment, the computer system 1300 may operate in the capacity of a server or as a client user computer in a server-client user network environment, as a peer computer system in a peer-to-peer (or distributed) network environment, or in various other ways. The computer system 1300 can also be implemented as or incorporated into various devices, such as a telematics system, for example, in a vehicle. In other examples, any other machine capable of executing a set of instructions (sequential or otherwise) that specify actions to be taken by that machine may be used. The computer system 1300 may be implemented using electronic devices that provide voice, audio, video or data communication. While a single computer system 1300 is illustrated, the term "system" may include any collection of systems or sub-systems that individually or jointly execute a set, or multiple sets, of instructions to perform one or more computer functions.

The computer system 1300 may include a processor 1302, such as a central processing unit (CPU), a graphics processing unit (GPU), a digital signal processor (DSP), or some combination of different or the same processors. The processor 1302 may be a component in a variety of systems. For example, the processor 1302 may be part of a head unit or amplifier in a vehicle. The processor 1302 may be one or more general processors, digital signal processors, application specific integrated circuits, field programmable gate arrays, digital circuits, analog circuits, combinations thereof, or other now known or later developed devices for analyzing and processing data. The processor 1302 may implement a software program, such as code generated manually or programmed.

The processor 1302 may operate and control at least a portion of the system. The term "module" may be defined to include one or more executable modules. The modules may include software, hardware, firmware, or some combination thereof executable by a processor, such as processor 1302. Software modules may include instructions stored in memory, such as memory 1304, or another memory device, that may be executable by the processor 1302 or other processor. Hardware modules may include various devices, components, circuits, gates, circuit boards, and the like that are executable, directed, or controlled for performance by the processor 1302.

The computer system 1300 may include a memory 1304, such as a memory 1304 that can communicate via a bus 1308. The memory 1304 may be a main memory, a static memory, or a dynamic memory. The memory 1304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one example, the memory 1304 includes a cache or random access memory for the processor 1302. In alternative examples, the memory 1304 may be separate from the processor 1302, such as a cache memory of a processor, the system memory, or other memory. The memory 1304 may include an external storage device or database for storing data. Examples include a hard drive, compact disc ("CD"), digital video disc ("DVD"), memory card, memory stick, floppy disc, universal serial bus ("USB") memory device, or any other device operative to store data.

The computer system 1300 may or may not further include a display unit 1310, such as a liquid crystal display (LCD), an organic light emitting diode (OLED), a flat panel display, a solid state display, a cathode ray tube (CRT), a projector, or other now known or later developed display device for outputting determined information. The display 1310 may act as an interface for the user to control the functioning of the processor 1302, or specifically as an interface with the software stored in the memory 1304.

The computer system 1300 may include an input device 1312 configured to allow a user to interact with any of the components of computer system. The input device 1312 may be a microphone to receive voice commands, a keypad, a keyboard, or a cursor control device, such as a mouse, or a joystick, touch screen display, remote control or any other device operative to interact with the computer system 1300. A user of the system may, for example, input criteria or conditions to be considered by the system and/or the telematics system.

The computer system 1300 may include computer-readable medium that includes instructions or receives and executes instructions responsive to a propagated signal so that a device connected to a network 1326 can communicate voice, video, audio, images or any other data over the network 1326. The instructions may be transmitted or received over the network 1326 via a communication port or interface 1320, or using a bus 1308. The communication port or interface 1320 may be a part of the processor 1302 or may be a separate component. The communication port 1320 may be created in software or may be a physical connection in hardware. The communication port 1320 may be configured to connect with a network 1326, external media, the display 1310, or any other components in the computer system 1300, or combinations thereof. The connection with the network 1326 may be a physical connection, such as a wired Ethernet connection or may be established wirelessly. The additional connections with other components of the computer system 1300 may be physical connections or may be established wirelessly. The network 1326 may alternatively be directly connected to the bus 1308.

The network 1326 may include wired networks, wireless networks, Ethernet AVB networks, or combinations thereof. The wireless network may be a cellular telephone network, an 802.11, 802.16, 802.20, 802.1Q or WiMax network. Further, the network 1326 may be a public network, such as the Internet, a private network, such as an intranet, or combinations thereof, and may utilize a variety of networking protocols now available or later developed including, but not limited to TCP/IP based networking protocols. One or more components of the system may communicate with each other by or through the network 1326.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system for treatment of compressed audio signals, comprising:

a processor;

a sampler executable by the processor to divide an audio signal into a series of sequential samples;

a signal quality detector executable by the processor to identify a consistent brick wall frequency of the audio signal spanning a plurality of the sequential samples at an outset of the audio signal and to determine a signal treatment indication proportional to the brick wall frequency; and a signal enhancer executable by the processor to sequentially receive and analyze one or more sample components of the audio signal to identify lost parts of the audio signal in the one or more sample components of respective sequential samples, and apply to the audio signal, at a level in accordance with the signal quality indication, a corresponding signal treatment for each of the one or more sample components of respective sequential samples having a corresponding identified lost part.

2. The system of claim 1, wherein the series of sequential samples include sequential bins in a frequency domain that are determined using a Fast Fourier Transform, and wherein the signal quality detector is further executable to identify the consistent brick wall frequency by identification of one of the sequential bins as a candidate bin including the brick wall frequency.

3. The system of claim 2, wherein to identify the consistent brick wall frequency further includes one or more of:

a confirmation that spectral energy exists below the brick wall frequency;

a confirmation of height of the brick wall frequency above a predetermined threshold beyond that of a next higher frequency sequential bin; and a confirmation of steepness of a cutoff of the brick wall frequency above a predetermined threshold beyond that of the next higher frequency sequential bin.

4. The system of claim 1, wherein the signal treatment indication is set to one of:

(i) no signal treatment when the brick wall frequency does not exceed a minimum frequency threshold;

(ii) no signal treatment when the brick wall frequency exceeds a maximum frequency threshold; and (iii) a level of signal treatment decreasing as the brick wall frequency increases when the brick wall frequency is between the minimum frequency threshold and the maximum frequency threshold.

5. The system of claim 1, wherein the signal quality detector is further executable to:

set the signal treatment indication to apply no signal treatment before detection of the consistent brick wall frequency of the audio signal; and latch the signal treatment indication to apply the treatment to the audio signal upon identification of a consecutive predefined number of samples indicative of the consistent brick wall frequency of the audio signal.

6. The system of claim 5, wherein the consecutive predefined number of samples is twenty.

7. The system of claim 5, wherein the consecutive predefined number of samples represents a time period of between one tenth of a second to one half of a second of the audio signal.

8. The system of claim 1, wherein the signal quality detector is further executable to:

reset an auto timer responsive to detection of the outset of the audio signal;

evaluate the plurality of the sequential samples to identify the consistent brick wall frequency of the audio signal until the auto timer expires; and discontinue evaluation of the plurality of the sequential samples once the auto timer expires.

9. The system of claim 1, wherein the signal quality detector is further executable to reset the quality indication upon identification of a period of audio signal intensity below a predetermined threshold for a predetermined time period.

10. The system of claim 1, wherein one or more of:

the sample components are frequency components and the corresponding signal treatments are frequency components applied to sample components with missing frequency components above a cutoff frequency threshold;

the sample components are transient components and the corresponding signal treatments are transient components applied to sample components with missing transients to enhance an onset of an existing transient present in the audio signal; and the sample components are reverberation components and the corresponding signal treatments are applied to sample components with missing reverberation to reduce a decay rate of the audio signal.

11. The system of claim 1, wherein the corresponding signal treatment is a plurality of signal treatments comprising a bandwidth extension treatment, a transient enhancement treatment and a reverberation fill treatment.

12. The system of claim 1, wherein the signal enhancer includes a plurality of signal enhancers, and wherein each of the signal enhancers is executed by the processor to independently operate on a spatial slice of a listener perceived sound stage to add at least one signal treatment, the listener perceived sound stage perceived by a listener during playback of the audio signal.

13. The system of claim 1, wherein the signal enhancer is configured to generate a plurality of corresponding signal treatments, the corresponding signal treatments being added to the audio signal.

14. A non-transitory computer readable storage medium storing computer readable instructions executable by a processor to treat compressed audio signals, the computer readable medium comprising:

- instructions executable by the processor to create a sequence of sequential samples of an audio signal;
- instructions executable by the processor to identify a consistent brick wall frequency of the audio signal spanning a plurality of the sequential samples at an outset of the audio signal and to determine a signal treatment indication proportional to the brick wall frequency;
- instructions executable by the processor to sequentially receive and analyze one or more sample components of the audio signal to identify lost parts of the audio signal in the one or more sample components of respective sequential samples; and
- instructions executable by the processor to apply to the audio signal, at a level in accordance with the signal quality indication, a corresponding signal treatment for each of the one or more sample components of respective sequential samples having a corresponding identified lost part.

15. The computer readable storage medium of claim 14, wherein the sequence of sequential samples includes sequential bins in a frequency domain determined using a Fast Fourier Transform, and wherein the instructions executable by the processor further include instructions to identify the consistent brick wall frequency by identification of one of the sequential bins as a candidate bin including the brick wall frequency.

16. The computer readable storage medium of claim 14, wherein the instructions executable by the processor to identify the consistent brick wall frequency further include one or more of:

- instructions executable by the processor to confirm that spectral energy exists below the brick wall frequency;
- instructions executable by the processor to confirm height of the brick wall frequency above a predetermined threshold beyond that of a next higher frequency sequential bin; and
- instructions executable by the processor to confirm steepness of a cutoff of the brick wall frequency above a predetermined threshold beyond that of the next higher frequency sequential bin.

17. The computer readable storage medium of claim 14, wherein the signal treatment indication is set to one of:

(i) no signal treatment when the brick wall frequency does not exceed a minimum frequency threshold;

(ii) no signal treatment when the brick wall frequency exceeds a maximum frequency threshold; and (iii) a level of signal treatment decreasing as the brick wall frequency increases when the brick wall frequency is between the minimum frequency threshold and the maximum frequency threshold.

18. The computer readable storage medium of claim 14, wherein the instructions executable by the processor further includes:

- instructions executable by the processor to set the signal treatment indication to apply no signal treatment before detection of the consistent brick wall frequency of the audio signal; and
- instructions executable by the processor to latch the signal treatment indication to apply the treatment to the audio signal upon identification of a consecutive predefined number of samples indicative of the consistent brick wall frequency of the audio signal.

19. The computer readable storage medium of claim 18, wherein the consecutive predefined number of samples is one or more of (i) twenty consecutive samples, and (ii) a number of consecutive samples representing a time period of between one tenth of a second to one half of a second of the audio signal.

20. The computer readable storage medium of claim 14, wherein the instructions executable by the processor further includes:

- instructions executable by the processor to reset an auto timer responsive to detection of the outset of the audio signal;
- instructions executable by the processor to evaluate the plurality of the sequential samples to identify the consistent brick wall frequency of the audio signal until the auto timer expires; and
- instructions executable by the processor to discontinue evaluation of the plurality of the sequential samples once the auto timer expires.

21. The computer readable storage medium of claim 14, wherein the instructions executable by the processor further include instructions to reset the quality indication upon identification of a period of audio signal intensity below a predetermined threshold for a predetermined time period.

22. The computer readable storage medium of claim 14, wherein one or more of:

- the sample components are frequency components and the corresponding signal treatments are frequency components applied to sample components with missing frequency components above a cutoff frequency threshold;
- the sample components are transient components and the corresponding signal treatments are transient components applied to sample components with missing transients to enhance an onset of an existing transient present in the audio signal; and
- the sample components are reverberation components and the corresponding signal treatments are applied to sample components with missing reverberation to reduce a decay rate of the audio signal.

23. A method of treating compressed audio signals comprising:

- separating an audio signal into sequential samples using a processor;
- identifying, using the processor, a consistent brick wall frequency of the audio signal spanning a plurality of the sequential samples at an outset of the audio signal and determine a signal treatment indication proportional to the brick wall frequency;
- sequentially analyzing, using the processor, one or more sample components of the audio signal to identify lost parts of the audio signal in the one or more sample components of respective sequential samples; and
- apply to the audio signal using the processor, at a level in accordance with the signal quality indication, a corresponding signal treatment for each of the one or more sample components of respective sequential samples having a corresponding identified lost part.

24. The method of claim 23, wherein the sequential samples includes sequential bins in a frequency domain determined using a Fast Fourier Transform, and to identify the consistent brick wall frequency includes identification of one of the sequential bins as a candidate bin including the brick wall frequency.

25. The method of claim 23, further comprising one or more of:

confirming that spectral energy exists below the brick wall frequency;

confirming height of the brick wall frequency above a predetermined threshold beyond that of a next higher frequency sequential bin; and confirming steepness of a cutoff of the brick wall frequency above a predetermined threshold beyond that of the next higher frequency sequential bin.

26. The method of claim 23, wherein the signal treatment indication is set to one of:

(i) no signal treatment when the brick wall frequency does not exceed a minimum frequency threshold;

(ii) no signal treatment when the brick wall frequency exceeds a maximum frequency threshold; and (iii) a level of signal treatment decreasing as the brick wall frequency increases when the brick wall frequency is between the minimum frequency threshold and the maximum frequency threshold.

27. The method of claim 23, further comprising:

setting the signal treatment indication to apply no signal treatment before detection of the consistent brick wall frequency of the audio signal; and latching the signal treatment indication to apply the treatment to the audio signal upon identification of a consecutive predefined number of samples indicative of the consistent brick wall frequency of the audio signal.

28. The method of claim 27, wherein the consecutive predefined number of samples is one or more of (i) twenty consecutive samples, and (ii) a number of consecutive samples representing a time period of between one tenth of a second to one half of a second of the audio signal.

29. The method of claim 23, further comprising:

resetting an auto timer responsive to detection of the outset of the audio signal; and evaluating the plurality of the sequential samples to identify the consistent brick wall frequency of the audio signal until the auto timer expires; and discontinuing evaluation of the plurality of the sequential samples once the auto timer expires.

30. The method of claim 23, further comprising resetting the quality indication upon identification of a period of audio signal intensity below a predetermined threshold for a predetermined time period.

31. The method of claim 23, wherein one or more of:

the sample components are frequency components and the corresponding signal treatments are frequency components applied to sample components with missing frequency components above a cutoff frequency threshold;

the sample components are transient components and the corresponding signal treatments are transient components applied to sample components with missing transients to enhance an onset of an existing transient present in the audio signal; and the sample components are reverberation components and the corresponding signal treatments are applied to sample components with missing reverberation to reduce a decay rate of the audio signal.

* * * * *